US012810924B2

(12) United States Patent
Akel et al.

(10) Patent No.: US 12,810,924 B2
(45) Date of Patent: Nov. 24, 2026

(54) INTERFACE TECHNIQUES FOR STACKED MEMORY ARCHITECTURES

(71) Applicant: Micron Technology, Inc., Boise, ID (US)

(72) Inventors: Ameen D. Akel, Rancho Cordova, CA (US); Brent Keeth, Boise, ID (US); James Brian Johnson, Boise, ID (US); Chun-Yi Liu, Rancho Cordova, CA (US); Shivasankar Gunasekaran, Erie, CO (US); Paul A. Laberge, Shoreview, MN (US); Gregory A. King, Boise, ID (US); Sai Krishna Mylavarapu, Folsom, CA (US); Su Wei Lim, Penang (MY); Nathan A. Eckel, Lufkin, TX (US); Lance P. Johnson, Saint Paul, MN (US); Nathan D. Henningson, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 18/667,791

(22) Filed: May 17, 2024

(65) Prior Publication Data

US 2024/0404581 A1 Dec. 5, 2024
US 2025/0279133 A2 Sep. 4, 2025

Related U.S. Application Data

(60) Provisional application No. 63/470,676, filed on Jun. 2, 2023.

(51) Int. Cl.
*G11C 16/04* (2006.01)
*G11C 11/4093* (2006.01)
(Continued)

(52) U.S. Cl.
CPC .......... *G11C 11/4093* (2013.01); *H10B 80/00* (2023.02); *H10W 90/00* (2026.01); *H10W 90/792* (2026.01)

(58) Field of Classification Search
CPC ......... G11C 11/4093; G11C 5/02; G11C 5/06; G11C 29/44; H01L 24/08; H01L 25/0657;
(Continued)

(56) References Cited

U.S. PATENT DOCUMENTS 8,699,255 B2 * 4/2014 Yu ........................ G11C 11/4097 365/230.03
9,406,351 B2 * 8/2016 Stansfield ............. G11C 11/419
(Continued)

*Primary Examiner* — Pho M Luu
(74) *Attorney, Agent, or Firm* — Holland & Hart LLP

(57) ABSTRACT

Methods, systems, and devices for interface techniques for stacked memory architectures are described. A semiconductor system, such as a memory system, may distribute memory access circuitry among multiple semiconductor dies of a stack. A first die of the system may include logic circuitry operable to configure a set of multiple first interface blocks of the first die. Each first interface block may include circuitry operable to communicate with one or more second interface blocks of one or more second dies of the system to access a respective set of one or more memory arrays of the one or more second dies. In some examples, the system may include a respective controller for each first interface block to support access operations via the first interface block. The system may also include non-volatile storage, one or more sensors, or a combination thereof to support various operations of the system.

20 Claims, 8 Drawing Sheets

(51) Int. Cl.
*H10B 80/00* (2023.01)
*H10W 90/00* (2026.01)

(58) Field of Classification Search
CPC ........... H01L 25/18; H01L 2224/08145; H01L 2924/1431; H01L 2924/1436; H01L 2225/06513; H01L 2225/06541; H10B 80/00; G06F 13/16
See application file for complete search history.

(56) References Cited

U.S. PATENT DOCUMENTS

| | | | | |
|---|---|---|---|---|
| 10,621,267 | B2 * | 4/2020 | Strachan | H10B 63/80 |
| 10,643,705 | B2 * | 5/2020 | Choi | G06N 3/0495 |
| 10,699,761 | B2 * | 6/2020 | Berger | G11C 11/1657 |
| 11,688,436 | B2 * | 6/2023 | Lin | G11C 7/12<br>365/207 |
| 11,862,233 | B2 * | 1/2024 | Liu | G11C 11/4091 |
| 11,984,162 | B2 * | 5/2024 | Lin | G11C 7/14 |
| 12,112,825 | B2 * | 10/2024 | Su | G11C 11/4074 |

* cited by examiner

INTERFACE TECHNIQUES FOR STACKED MEMORY ARCHITECTURES

CROSS REFERENCE

The present Application for Patent claims priority to U.S. Patent Application No. 63/470,676 by Akel et al., entitled "INTERFACE TECHNIQUES FOR STACKED MEMORY ARCHITECTURES," filed Jun. 2, 2023, which is assigned to the assignee hereof, and which is expressly incorporated by reference in its entirety herein.

TECHNICAL FIELD

The following relates to one or more systems for memory, including interface techniques for stacked memory architectures.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not- and (NAND) memory devices, and others. Memory cells may be described in terms of volatile configurations or non-volatile configurations. Memory cells in a non-volatile configuration may maintain stored logic states for extended periods of time even in the absence of an external power source. Memory cells in a volatile configuration may lose stored states when disconnected from an external power source.

DETAILED DESCRIPTION

Figure 1:
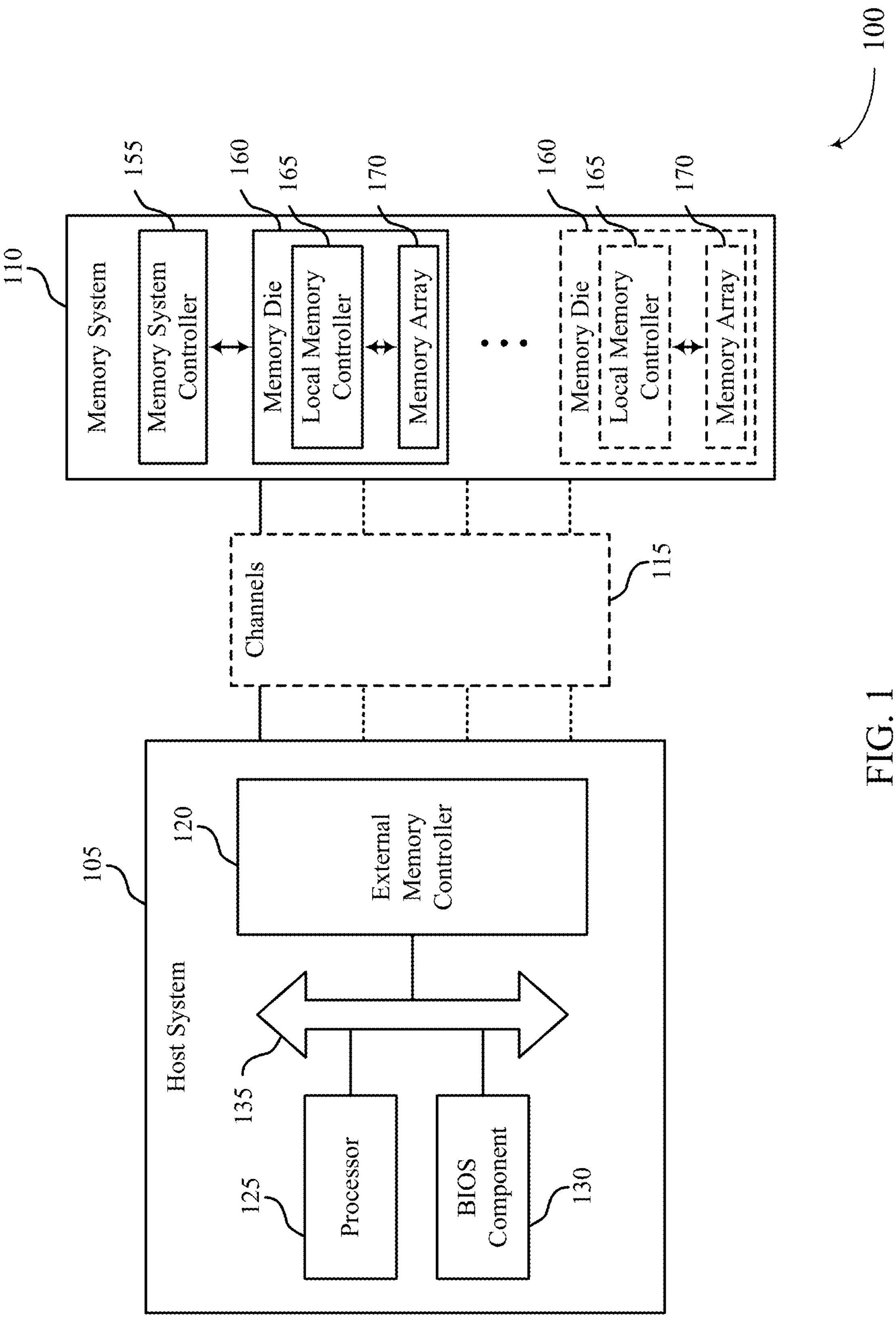
FIG. 1 shows an example of a system that supports interface techniques for stacked memory architectures in accordance with examples as disclosed herein.

Some memory systems may include a stack of semiconductor dies, including one or more memory dies above a logic die that is operable to access a set of memory arrays distributed across the one or more memory dies. Such an architecture may be implemented as part of a coupled dynamic random access memory (DRAM) system, and may support solutions for memory-centric logic, such as graphics processing units (GPUs), among other implementations. In some examples, a 3D stacked memory system may be closely coupled (e.g., physically coupled, electrically coupled) with a processor, such as a GPU or other host, as part of a physical memory map accessible to the processor. Such coupling may include one or more processors being implemented in a same semiconductor die as at least a portion of a 3D stacked memory system (e.g., as part of a logic die), or a processor being implemented in a die that is directly coupled (e.g., fused) with another die that includes at least a portion of a 3D stacked memory system. Unlike cache-based memory, 3D stacked memory system may not be backed by a level of external memory with the same physical addresses. For example, a 3D stacked memory system may be associated with and located within a dedicated base address, where each portion of the 3D stacked memory system may be non-overlapping within the address.

In accordance with examples as disclosed herein, a semiconductor system, such as a 3D stacked memory system or other memory system, may distribute memory access circuitry among multiple semiconductor dies of a stack (e.g., a stack of multiple directly-coupled semiconductor dies). For example, a first die (e.g., a logic die) of the system may include a logic block (e.g., a common logic block, a central logic block, logic circuitry) operable to configure a set of multiple first interface blocks (e.g., memory interface blocks, instances of first interface circuitry) of the first die. In some examples, the system may include a respective controller (e.g., a memory controller, a host interface controller, of the first die, of another die) for each first interface block to support access operations via the first interface block. The system may also include non-volatile storage, one or more sensors (e.g., temperature sensors, current sensors, voltage sensors, counters), or a combination thereof to support various operations of the system.

The set of first interface blocks may be configured to access one or more memory arrays of one or more second dies (e.g., array dies). For example, a first interface block of the first die may communicate with one or more second interface blocks (e.g., one or more instances of second interface circuitry) of a second die to access a respective set of one or more memory arrays (e.g., of the second die). In some examples, a first interface block (e.g., of the first die) may include circuitry to perform or otherwise support operations, such as initialization operations, evaluation operations, configuration operations, access operations, scheduling operations, repair operations, refresh operations, error control operations, adverse access operations, signaling operations, or other operations based on information (e.g., signaling, instructions, parameters, configuration information) of the system. However, various examples of the described techniques may include other distribution of memory access functionality among circuitry of multiple semiconductor dies.

A first interface block and a second interface block configured to access a corresponding set of one or more memory arrays may be communicatively coupled between dies using one or more of various interconnection techniques, such as a fusion of conductive contacts of the respective dies, which may enable a relatively higher density of contacts than other techniques. In some examples, a first die may also include aspects of a host system (e.g., a host processor), which may further reduce limitations associated with memory die interconnections. Such an architecture may be extended by including multiple sets of memory arrays on a given second die, each with a respective second interface block, or by stacking a set of multiple second dies over a given first die, or both, such that a given second die may include a respective second portion of the access circuitry for each set of memory arrays of the given second die. By dividing memory access circuitry among multiple semiconductor dies in accordance with one or more of the described techniques, a system may be configured with an increased throughput of information, or a greater storage density, among other advantages, compared with other techniques for configuring a memory system.

Features of the disclosure are illustrated and described in the context of systems and dies. Features of the disclosure are further illustrated and described in the context of interface architectures and flowcharts.

FIG. 1 illustrates an example of a system 100 that supports interface techniques for stacked memory architectures in accordance with examples as disclosed herein. The system 100 may include portions of an electronic device, such as a computing device, a mobile computing device, a wireless communications device, a graphics processing device, a vehicle, or other systems. The system 100 includes a host system 105, a memory system 110, and one or more channels 115 coupling the host system 105 with the memory system 110 (e.g., to provide a communicative coupling). The system 100 may include one or more memory systems 110, but aspects of the one or more memory systems 110 may be described in the context of a single memory system 110.

The host system 105 may be an example of a processor (e.g., circuitry, processing circuitry, one or more processing components) that uses memory to execute processes, such as a processing system of a computing device, a mobile computing device, a wireless communications device, a graphics processing device, a wearable device, an internet-connected device, a vehicle controller, a system on a chip (SoC), or other stationary or portable electronic device, among other examples. The host system 105 may include one or more of an external memory controller 120, a processor 125, a basic input/output system (BIOS) component 130, or other components (e.g., a peripheral component, an input/output controller, not shown). The components of the host system 105 may be coupled with one another using a bus 135.

An external memory controller 120 may be configured to enable communication of information (e.g., data, commands, control information, configuration information) between components of the system 100 (e.g., between components of the host system 105, such as the processor 125, and the memory system 110). An external memory controller 120 may process (e.g., convert, translate) communications exchanged between the host system 105 and the memory system 110. In some examples, an external memory controller 120, or other component of the system 100, or associated functions described herein, may be implemented by or be part of the processor 125. For example, an external memory controller 120 may be hardware, firmware, or software (e.g., instructions), or some combination thereof implemented by a processor 125 or other component of the system 100 or the host system 105. Although an external memory controller 120 is illustrated outside the memory system 110, in some examples, an external memory controller 120, or its functions described herein, may be implemented by one or more components of a memory system 110 (e.g., a memory system controller 155, a local memory controller 165) or vice versa. In various examples, the host system 105 or an external memory controller 120 may be referred to as a host.

A processor 125 may be operable to provide functionality (e.g., control functionality) for the system 100 or the host system 105. A processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination thereof. In some examples, a processor 125 may be an example of a central processing unit (CPU), a graphics processing unit (GPU), a general-purpose GPU (GPGPU), or an SoC, among other examples.

In some examples, the system 100 or the host system 105 may include an input component, an output component, or a combination thereof. Input components may include a sensor, a microphone, a keyboard, another processor (e.g., on a printed circuit board), an interface (e.g., a user interface, an interface between other devices), or a peripheral that interfaces with system 100 via one or more peripheral components, among other examples. Output components may include a display, audio speakers, a printing device, another processor on a printed circuit board, or a peripheral that interfaces with the system 100 via one or more peripheral components, among other examples.

The memory system 110 may be a component of the system 100 that is operable to provide physical memory locations (e.g., addresses) that may be used or referenced by the system 100. The memory system 110 may include a memory system controller 155 and one or more memory dies 160 (e.g., memory chips) to support a capacity for data storage. The memory system 110 may be configurable to work with one or more different types of host systems 105, and may respond to and execute commands provided by the host system 105 (e.g., via an external memory controller 120). For example, the memory system 110 (e.g., a memory system controller 155) may receive a write command indicating that the memory system 110 is to store data received from the host system 105, or receive a read command indicating that the memory system 110 is to provide data stored in a memory die 160 to the host system 105, or receive a refresh command indicating that the memory system 110 is to refresh data stored in a memory die 160, among other types of commands and operations.

A memory system controller 155 may include components (e.g., circuitry, logic) operable to control operations of the memory system 110. A memory system controller 155 may include hardware, firmware, or instructions that enable the memory system 110 to perform various operations, and may be operable to receive, transmit, or execute commands, data, or control information related to operations of the memory system 110. A memory system controller 155 may be operable to communicate with one or more of an external memory controller 120, one or more memory dies 160, or a processor 125. In some examples, a memory system controller 155 may control operations of the memory system 110 in cooperation with a local memory controller 165 of a memory die 160.

Each memory die 160 may include a local memory controller 165 and a memory array 170. A memory array 170 may be a collection of memory cells, with each memory cell being operable to store one or more bits of data. A memory die 160 may include a two-dimensional (2D) array of memory cells, or a three-dimensional (3D) array of memory cells. In some examples, a 2D memory die 160 may include a single memory array 170. In some examples, a 3D memory die 160 may include two or more memory arrays 170, which may be stacked or positioned beside one another (e.g., relative to a substrate).

A local memory controller 165 may include components (e.g., circuitry, logic) operable to control operations of a memory die 160. In some examples, a local memory controller 165 may be operable to communicate (e.g., receive or transmit data or commands or both) with a memory system controller 155. In some examples, a memory system 110 may not include a memory system controller 155, and a local memory controller 165 or an external memory controller 120 may perform various functions described herein. As such, a local memory controller 165 may be operable to communicate with a memory system controller 155, with other local memory controllers 165, or directly with an external memory controller 120, or a processor 125, or any combination thereof. Examples of components that may be included in a memory system controller 155 or a local memory controller 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, sense components for sensing states of memory cells of a memory array 170, write components for writing states to memory cells of a memory array 170, or various other components operable for supporting described operations of a memory system 110.

A host system 105 (e.g., an external memory controller 120) and a memory system 110 (e.g., a memory system controller 155) may communicate information (e.g., data, commands, control information, configuration information) using one or more channels 115. Each channel 115 may be an example of a transmission medium that carries information, and each channel 115 may include one or more signal paths (e.g., a transmission medium, an electrical conductor, an electrically conductive path) between terminals associated with the components of the system 100. For example, a channel 115 may be associated with a first terminal (e.g., including one or more pins, including one or more pads) at the host system 105 and a second terminal at the memory system 110. A terminal may be an example of a conductive input or output point of a device of the system 100, and a terminal may be operable to act as part of a channel 115. In some implementations, at least the channels 115 between a host system 105 and a memory system 110 may include or be referred to as a host interface (e.g., a physical host interface). In some implementations, a host interface may include or be associated with interface circuitry (e.g., signal drivers, signal latches) at the host system 105 (e.g., at an external memory controller 120), or at the memory system 110 (e.g., at a memory system controller 155), or both.

In some examples, a channel 115 (e.g., associated signal paths and terminals) may be dedicated to communicating one or more types of information. For example, the channels 115 may include one or more command and address channels, one or more clock signal channels, one or more data channels, among other channels or combinations thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols of a signal may be registered for each clock cycle (e.g., on both a rising edge and a falling edge of a clock signal).

In some examples, at least a portion of the system 100 may implement a stacked die architecture in which multiple semiconductor dies are physically and communicatively coupled. In some implementations, one or more semiconductor dies may include multiple instances of interface circuitry (e.g., of a memory system 110, memory interface blocks) that are each associated with accessing a respective set of one or more memory arrays of one or more other semiconductor dies.

In accordance with examples as disclosed herein, circuitry for accessing one or more memory arrays 170 may be distributed among multiple semiconductor dies of a stack (e.g., a stack of multiple directly-coupled semiconductor dies). For example, a first die may include a logic block (e.g., a common logic block, a central logic block, logic circuitry) operable to configure a set of multiple first interface blocks (e.g., memory interface blocks, instances of first interface circuitry) of the first die. In some examples, the system may include a respective controller (e.g., a memory controller, a host interface controller, at least a portion of a memory system controller 155, at least a portion of an external memory controller 120, or a combination thereof) for each first interface block to support access operations (e.g., to access one or more memory arrays 170) via the first interface block. The system may also include non-volatile storage, one or more sensors, or a combination thereof to support various operations of the system.

The multiple first interface blocks may be operable to configure operations of the multiple semiconductor dies in the stack. For example, a first interface block (e.g., of the first die) may include circuitry to perform operations, such as such as initialization operations, evaluation operations, configuration operations, access operations, scheduling operations, repair operations, refresh operations, error control operations, adverse access operations, signaling operations, or other operations based on information (e.g., signaling, instructions, parameters, configuration information) of the memory system 110. By dividing memory access circuitry among multiple semiconductor dies in accordance with one or more of the described techniques, a system may be configured with an increased throughput of information, or a greater storage density, among other advantages, compared with other techniques for configuring a memory system.

In addition to applicability in systems as described herein, interface techniques for stacked memory architectures may be generally implemented to support artificial intelligence applications. As the use of artificial intelligence increases to support machine learning, analytics, decision making, or other related applications, electronic devices that support artificial intelligence applications and processes may be desired. For example, artificial intelligence applications may be associated with accessing relatively large quantities of data for analytical purposes and may benefit from memory systems capable of effectively and efficiently storing relatively large quantities of data or accessing stored data relatively quickly. Implementing the techniques described herein may support artificial intelligence or machine learning techniques by supporting efficient accessing of information via a relatively high quantity of closely-coupled interfaces (e.g., channels, data paths, support stacks) between a host and memory arrays of one or more semiconductor dies that are stacked over a logic die, among other benefits.

Figure 2:
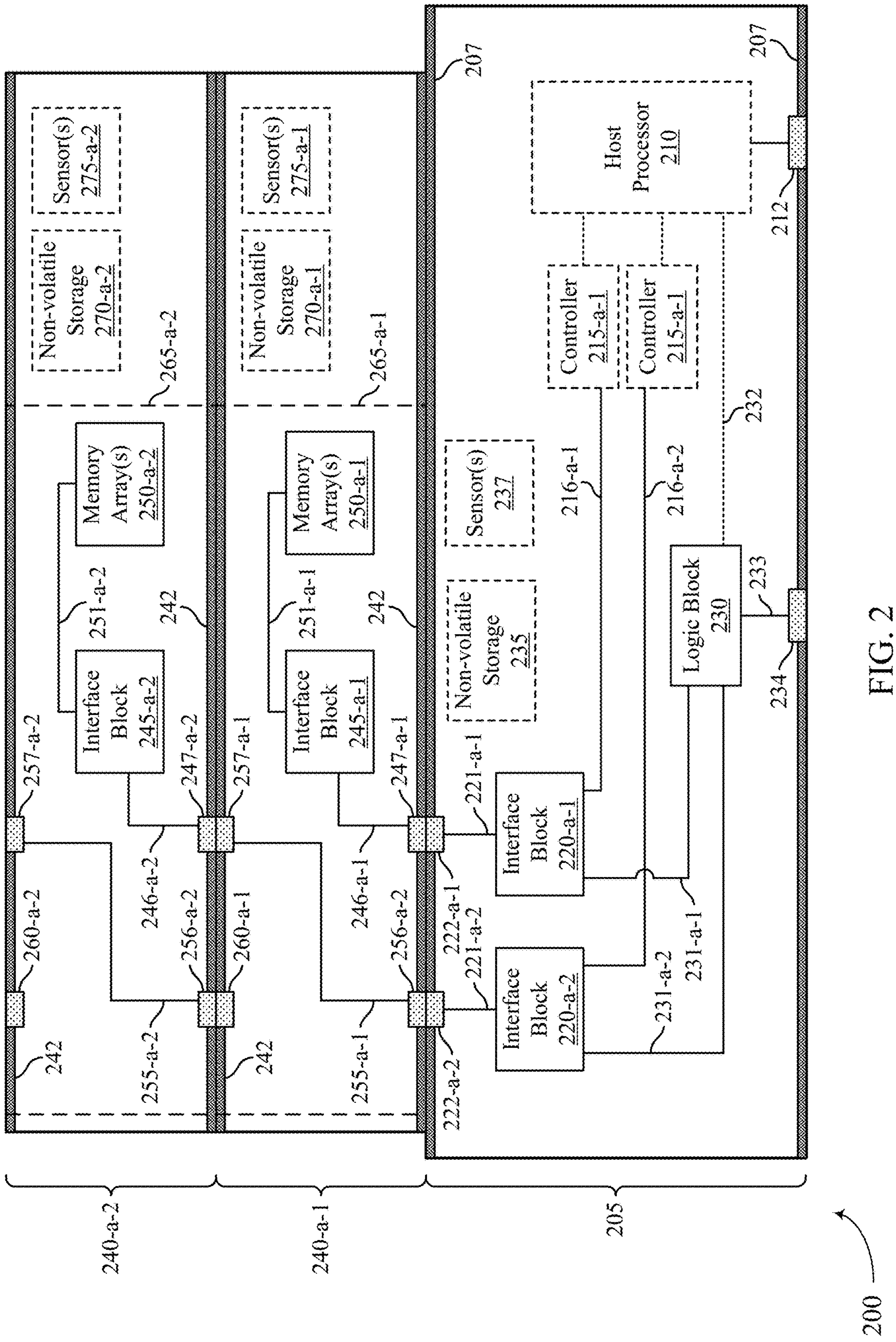
FIG. 2 shows an example of a system that supports interface techniques for stacked memory architectures in accordance with examples as disclosed herein.

FIG. 2 illustrates an example of a system 200 (e.g., a semiconductor system, a system of coupled semiconductor dies) that supports interface techniques for stacked memory architectures in accordance with examples as disclosed herein. The system 200 illustrates an example of a die 205 (e.g., a semiconductor die, a host die, a processor die, a logic die) that is coupled with one or more dies 240 (e.g., dies 240-*a*-1 and 240-*a*-2, semiconductor dies, memory dies, array dies). A die 205 or a die 240 may be formed using a respective semiconductor substrate (e.g., a substrate of crystalline semiconductor material such as silicon, germanium, silicon-germanium, gallium arsenide, or gallium nitride), or a silicon-on-insulator (SOI) substrate (e.g., silicon-on-glass (SOG), silicon-on-sapphire (SOS)), or epitaxial semiconductor materials formed on another substrate, among other examples. Although the illustrated example of a system 200 includes two dies 240, a system 200 in accordance with the described techniques may include any quantity of one or more dies 240 coupled with a die 205. Further, although non-limiting examples of the system 200 herein are generally described in terms of applicability to memory systems, memory sub-systems, memory devices, or a combination thereof, examples of the system 200 are not so limited. For example, aspects of the present disclosure may be applied as well to any computing system, computing sub-system, processing system, processing sub-system, component, device, structure, or other types of systems or sub-systems used for applications such as data collecting, data processing, data storage, networking, communication, power, artificial intelligence, system-on-a-chip, control, telemetry, sensing and monitoring, digital entertainment, or any combination thereof.

The system 200 illustrates an example of interface circuitry between a host and memory (e.g., via a host interface, via a physical host interface) that is implemented in (e.g., divided between) multiple semiconductor dies (e.g., a stack of directly coupled dies). For example, the die 205 may include a set of one or more interface blocks 220 (e.g., interface blocks 220-*a*-1 and 220-*a*-2, memory interface blocks), and each die 240 may include a set of one or more interface blocks 245 and one or more memory arrays 250 (e.g., die 240-*a*-1 including an interface block 245-*a*-1 coupled with a set of one or more memory arrays 250-*a*-1, die 240-*a*-2 including an interface block 245-*a*-2 coupled with a set of one or more memory arrays 250-*a*-2). The memory arrays 250 may be examples of memory arrays 170, and may include memory cells of various architectures, such as RAM, DRAM, SDRAM, SRAM, FeRAM, MRAM, RRAM, PCM, chalcogenide, NOR, or NAND memory cells, or any combination thereof.

Although the example of system 200 is illustrated with one interface block 245 included in each die 240, a die 240 in accordance with the described techniques may include any quantity of one or more interface blocks 245, each coupled with a respective set of one or more memory arrays 250, and each coupled with a respective interface block 220 of a die 205. Thus, the interface circuitry of a system 200 may include one or more interface blocks 220 of a die 205, with each interface block 220 being coupled with (e.g., in communication with) a corresponding interface block 245 of a die 240 (e.g., external to the die 205). In some examples, a coupled combination of an interface block 220 and an interface block 245 (e.g., coupled via a bus associated with one or more channels, such as one or more data channels, one or more control channels, one or more clock channels, or a combination thereof) may include or be referred to as a data path associated with a respective set of one or more memory arrays 250.

In some implementations, the die 205 may include a host processor 210. A host processor 210 may be an example of a host system 105, or a portion thereof (e.g., a processor 125, aspects of an external memory controller 120, or both). The host processor 210 may be configured to perform operations that implement storage of the memory arrays 250. For example, the host processor 210 may receive data read from the memory arrays 250, or may transmit data to be written to the memory arrays 250, or both (e.g., in accordance with an application or other operations of the host processor 210). Additionally, or alternatively, a host processor 210 may be external to a die 205, such as in another semiconductor die or other component that is coupled with (e.g., communicatively coupled with, directly coupled with, bonded with) the die 205 via one or more contacts 212.

A host processor 210 may be configured to communicate (e.g., transmit, receive) signaling with the interface blocks 220 over one or more host interfaces 216 (e.g., a physical host interface), which may implement aspects of channels 115 described with reference to FIG. 1. For example, the host processor 210 may be configured to transmit access signaling (e.g., control signaling, access command signaling, configuration signaling) over host interfaces 216, which may be received by the interface blocks 220 to support access operations (e.g., read operations, write operations) on the memory arrays 250. In some examples, a host interface 216 may include a respective set of one or more signal paths for each interface block 220, such that the host processor 210 may communicate with each interface block 220 over the respective set of signal paths (e.g., in accordance with a selection of the respective set to perform access operations via an interface block 220 that is selected by the host processor 210). Additionally, or alternatively, a host interface 216 may include one or more signal paths that are shared among multiple interface blocks 220 (not shown), and an interface block 220, or a host processor 210, or both may interpret, ignore, respond to, or inhibit response to signaling over shared signal paths of the host interface 216 based on a logical indication (e.g., an addressing indication associated with the interface block 220 or an interface enable signal, which may be provided by the host processor 210 or the corresponding interface block 220, depending on signaling direction).

In some examples, a respective host interface 216 may be coupled between a set of one or more interface blocks 220 and a controller 215 (e.g., host interface 216-*a*-1 coupled between interface block 220-*a*-1 and controller 215-*a*-1, host interface 216-*a*-2 coupled between interface block 220-*a*-2 and controller 215-*a*-2). The one or more interface blocks 220 and the controller 215 may communicate (e.g., collaborate) to perform one or more operations (e.g., scheduling operations, access operations, operations initiated by a host processor 210) associated with a memory array 250. A controller 215 may be an example of control circuitry (e.g., memory controller circuitry, host interface control circuitry), and may be associated with implementing respective instances of one or more aspects of an external memory controller 120, or of a memory system controller 155, or a combination thereof for each interface block 220. In some examples, controllers 215 may be implemented in a die 205 whether a host processor 210 is included in the die 205, or is external to the die 205, and the interface block 220 may communicate with the host processor 210 via one or more controllers 215. In some other examples, controllers 215 may be implemented external to a die 205 (e.g., in another die, not shown, coupled with respective interface blocks 220 via respective terminals for each of the respective host interfaces 216), which may be in a same die as or a different die from a die that includes a host processor 210. In some other examples, aspects of one or more controllers 215 may be included in the host processor 210. Although the example of system 200 is illustrated as including a controller 215 for each interface block 220, in various examples, a controller 215 may be coupled with any quantity of one or more interface blocks 220, and a given interface block 220 may be operable based on single controller 215, or by one or more of a set of multiple controllers 215 (e.g., in accordance with a controller multiplexing scheme).

In some examples, a host processor 210 may determine to access an address (e.g., a logical address of a memory array 250, a physical address of a memory array 250, an address of an interface block 220), and determine which controller 215 to transmit access signaling to for accessing the address (e.g., a controller 215 or interface block 220 corresponding to the address). The host processor 210 may transmit access signaling to the determined controller 215 and, in turn, the determined controller 215 may transmit access signaling to the corresponding interface block 220. The corresponding interface block 220 may subsequently transmit access signaling to the coupled interface block 245 to access the determined address (e.g., in a corresponding memory array 250).

A die 205 may also include a logic block 230 (e.g., a shared logic block, a central logic block, common logic circuitry), which may be configured to communicate (e.g., transmit, receive) signaling with the interface blocks 220 of the die 205. In some cases, the logic block 230 may be configured to communicate information (e.g., commands, instructions, indications, data) with one or more interface blocks 220 to facilitate operations of the system 200. For example, a logic block 230 may be configured to transmit configuration signaling (e.g., initialization signaling, evaluation signaling), which may be received by interface blocks 220 to support configuration of the interface blocks 220 or other aspects of operating the dies 240 (e.g., via the respective interface blocks 245). A logic block 230 may be coupled with each interface block 220 via a respective bus 231 (e.g., bus 231-*a*-1 associated with the interface block 220-*a*-1, bus 231-*a*-2 associated with the interface block 220-*a*-2). In some examples, respective buses 231 may each include a respective set of one or more signal paths, such that a logic block 230 may communicate with each interface block 220 over the respective set of signal paths. Additionally, or alternatively, respective buses 231 may include one or more signal paths that are shared among multiple interface blocks 220 (not shown).

In some implementations, a logic block 230 may be configured to communicate (e.g., transmit, receive) signaling with a host processor 210 (e.g., over a bus 232, via a contact 212 for a host processor 210 external to a die 205) such that the logic block 230 may support an interface between the interface blocks 220 and the host processor 210. For example, a host processor 210 may be configured to transmit initialization signaling (e.g., boot commands), or other configuration or operational signaling, which may be received by a logic block 230 to support initialization, configuration, or other operations of the interface blocks 220. Additionally, or alternatively, in some implementations, a logic block 230 may be configured to communicate (e.g., transmit, receive) signaling with a component outside the system 200 via a bus 233 (e.g., and via a contact 234), such that the logic block 230 may support an interface that bypasses a host processor 210. Additionally, or alternatively, a logic block 230 may communicate with a host processor 210, and may communicate with one or more memory arrays 250 of one or more dies 240 (e.g., to perform self-test operations for the memory arrays 250). In some examples, such implementations may support evaluations, configurations, or other operations of the system 200, via contacts 234 that are accessible at a physical interface of the system, during manufacturing, assembly, validation, or other operation associated with the system 200 (e.g., before coupling with a host processor 210, without implementing a host processor 210, for operations independent of a host processor).

Each interface block 220 may be coupled with at least a respective bus 221 of the die 205, and a respective bus 246 of a die 240, that are configured to communicate signaling with a corresponding interface block 245 (e.g., over one or more associated signal paths). For example, the interface block 220-*a*-1 may be coupled with the interface block 245-*a*-1 via a bus 221-*a*-1 and a bus 246-*a*-1, and the interface block 220-*a*-2 may be coupled with the interface block 245-*a*-2 via a bus 221-*a*-2 and a bus 246-*a*-2. In some examples, a die 240 may include a bus that bypasses operational circuitry of the die 240 (e.g., bypasses interface blocks 245 of a given die 240), such as a bus 255. For example, the interface block 220-*a*-2 may be coupled with the interface block 245-*a*-2 of the die 240-*a*-2 via a bus 255-*a*-1 of the die 240-*a*-1, which may bypass interface blocks 245 of the die 240-*a*-1. Such techniques may be extended for interconnection among more than two dies 240 (e.g., for interconnection via a respective bus 255 of multiple dies 240).

The respective signal paths of buses 221, 246, and 255 may be coupled with one another, from one die to another, via various arrangements of contacts at the surfaces of interfacing dies. For example, the bus 221-*a*-1 may be coupled with the bus 246-*a*-1 via a contact 222-*a*-1 of (e.g., at a surface of) the die 205 and a contact 247-*a*-1 of the die 240-*a*-1, the bus 221-*a*-2 may be coupled with the bus 255-*a*-1 via a contact 222-*a*-2 of the die 205 and a contact 256-*a*-1 of the die 240-*a*-1, the bus 255-*a*-1 may be coupled with the bus 246-*a*-2 via a contact 257-*a*-1 of the die 240-*a*-1 and a contact 247-*a*-2 of the die 240-*a*-2, and so on. Although each respective bus is illustrated with a single line, coupled via singular contacts, it is to be understood that each signal path of a given bus may be associated with respective contacts to support a separate communicative coupling via each signal path of the given bus. In some examples, a bus 255 may traverse a portion of a die 240 (e.g., in an in-plane direction, along a direction different from a thickness direction, in a waterfall arrangement), which may support an arrangement of contacts 222 along a surface of a die 205 being coupled with interface blocks 245 of different dies 240 along a stack direction (e.g., via respective contacts 256 and 257 that are non-overlapping when viewed along a thickness direction).

The interconnection of interfacing contacts may be supported by various techniques. For example, in a hybrid bonding implementation, interfacing contacts may be coupled by a fusion of conductive materials (e.g., electrically conductive materials) of the interfacing contacts (e.g., without solder or other intervening material between contacts). For example, in an assembled condition, the coupling of the die 205 with the die 240-*a*-1 may include a conductive material of the contact 222-*a*-2 being fused with a conductive material of the contact 256-*a*-1, and the coupling of the die 240-*a*-1 with the die 240-*a*-2 may include a conductive material of the contact 257-*a*-1 being fused with a conductive material of the contact 247-*a*-2, and so on. In some examples, such coupling may include an inoperative fusion of contacts (e.g., a non-communicative coupling, a physical coupling), such as a fusion of the contact 260-*a*-1 with the contact 256-*a*-2, neither of which are coupled with operative circuitry of the dies 240-*a*-1 or 240-*a*-2. In some examples, such techniques may be implemented to improve coupling strength or uniformity (e.g., implementing contacts 260, which may not be operatively coupled with an interface block 245 or an interface block 220), or such a coupling may be a byproduct of a repetition of components that, in various configurations, may be operative or inoperative. (e.g., where, for dies 240 with a common arrangement of contacts 256 and 257, contacts 256-*a*-1 and 257-*a*-1 provide a communicative path between the interface block 245-*a*-2 and the interface block 220-*a*-2, but the contacts 256-*a*-2 and 257-*a*-2 do not provide a communicative path between an interface block 245 and an interface block 220).

In some examples, a fusion of conductive materials between dies (e.g., between contacts) may be accompanied by a fusion of other materials at one or more surfaces of the interfacing dies. For example, in an assembled condition, the coupling of the die 205 with the die 240-*a*-1 may include a dielectric material 207 (e.g., an electrically non-conductive material) of the die 205 being fused with a dielectric material 242 of the die 240-*a*-1, and the coupling of the die 240-*a*-1 with the die 240-*a*-2 may include a dielectric material 242 of the die 240-*a*-1 being fused with a dielectric material 242 of the die 240-*a*-2. In some examples, such dielectric materials may include an oxide, a nitride, a carbide, an oxide-nitride, an oxide-carbide, or other conversion or doping of a semiconductor material of the die 205 or dies 240, among other materials that may support such fusion. However, coupling among dies 205 and dies 240 may be implemented in accordance with other techniques, which may implement solder, adhesives, thermal interface materials, and other intervening materials.

In some examples, dies 240 may be coupled in a stack (e.g., forming a "cube" or other arrangement of dies 240), and the stack may subsequently be coupled with a die 205. In some examples, a respective set of one or more dies 240 may be coupled with each die 205 of multiple dies 205 formed in a wafer (e.g., in a chip-to-wafer bonding arrangement, before cutting the wafer of dies 205), and the dies 205, coupled with their respective set of dies 240, may be separated from one another (e.g., by cutting at least the wafer of dies 205). In some other examples, a respective set of one or more dies 240 may be coupled with a respective die 205 after the die 205 is separated from a wafer of dies 205 (e.g., in a chip-to-chip bonding arrangement).

The buses 221, 246, and 255 may be configured to provide a configured signaling (e.g., a coordinated signaling, a logical signaling, modulated signaling, digital signaling) between an interface block 220 and a corresponding interface block 245, which may involve various modulation or encoding techniques by a transmitting interface block (e.g., via a driver component of the transmitting interface block). In some examples, such signaling may be supported by (e.g., accompanied by) clock signaling communicated via the respective buses (e.g., in coordination with signal transmission). For example, the buses may be configured to convey one or more clock signals transmitted by the interface block 220 for reception by the interface block 245 (e.g., to trigger signal reception by a latch or other reception component of the interface block 245, to support clocked operations of the interface block 245). Additionally, or alternatively, the buses may be configured to convey one or more clock signals transmitted by the interface block 245 for reception by the interface block 220 (e.g., to trigger signal reception by a latch or other reception component of the interface block 220, to support clocked operations of the interface block 220). Such clock signals may be associated with the communication (e.g., unidirectional communication, bidirectional communication) of various signaling, such as control signaling, command signaling, data signaling, or any combination thereof. For example, the buses may include one or more signal paths for communications of a data bus (e.g., one or more data channels, a DQ bus, via a data interface of the interface blocks) in accordance with one or more corresponding clock signals (e.g., data clock signals), or one or more signal paths for communications of a control bus (e.g., a command/address (C/A) bus, via a command interface of the interface blocks) in accordance with one or more clock signals (e.g., control clock signals), or any combination thereof.

Interface blocks 220, interface blocks 245, and logic block 230 each may include circuitry (signaling circuitry, multiplexing circuitry, processing circuitry, controller circuitry) in various configurations (e.g., hardware configurations, logic configurations, software or instruction configurations) that support the functionality allocated to the respective block for accessing or otherwise operating a corresponding set of memory arrays 250. For example, interface blocks 220 may include circuitry configured to perform a first subset of operations that support access of the memory arrays 250, and interface blocks 245 may include circuitry configured to support a second subset of operations that support access of the memory arrays 250. In some examples, the interface blocks 220 and 245 may support a functional split or distribution of functionality associated with a memory system controller 155, a local memory controller 165, or both across multiple dies (e.g., a die 205 and at least one die 240). In some implementations, a logic block 230 may be configured to coordinate or configure aspects of the operations of the interface blocks 220, of the interface blocks 245, or both, and may support implementing one or more aspects of a memory system controller 155. Such operations, or subsets of operations, may include operations performed in response to commands from the host processor 210, or operations performed without commands from the host processor 210 (e.g., operations determined or initiated by an interface block 220, operations determined or initiated by an interface block 245, operations determined or initiated by a logic block 230), or various combinations thereof.

In some implementations, the system 200 may include one or more instances of non-volatile storage (e.g., non-volatile storage 235 of a die 205, non-volatile storage 270 of one or more dies 240, or a combination thereof). In some examples, a logic block 230, interface blocks 220, interface blocks 245, or a combination thereof may be configured to communicate signaling with one or more instances of non-volatile storage. For example, a logic block 230, interface blocks 220, or interface blocks 245 may be coupled with one or more instances of non-volatile storage via one or more buses (not shown), or respective contacts (not shown), where applicable, which may each include one or more signal paths operable to communicate signaling (e.g., command signaling, data signaling). In some examples, a logic block 230, one or more interface blocks 220, one or more interface blocks 245, or a combination thereof may configure one or more operations based on information stored in one or more instances of non-volatile storage. Additionally, or alternatively, in some examples, a logic block 230, one or more interface blocks 220, one or more interface blocks 245, or a combination thereof may write information (e.g., configuration information) to be stored in one or more instances of non-volatile storage.

In some implementations, the system 200 may include one or more sensors (e.g., one or more sensors 237 of a die 205, one or more sensors 275 of one or more dies 240, or a combination thereof). In some implementations, a logic block 230, interface blocks 220, interface blocks 245, or a combination thereof may be configured to receive one or more indications based on measurements of one or more sensors of the system 200. For example, a logic block 230, interface blocks 220, or interface blocks 245 may be coupled with one or more sensors via one or more buses (not shown), or respective contacts (not shown). Such sensors may include temperature sensors, current sensors, voltage sensors, counters, and other types of sensors. In some examples, a logic block 230, one or more interface blocks 220, one or more interface blocks 245, or a combination thereof may configure one or more operations based on output of the one or more sensors. For example, a logic block 230 may configure one or more operations of interface blocks 220 based on signaling (e.g., indications, data) received from the one or more sensors. Additionally, or alternatively, an interface block 220 may generate access signaling for transmitting to a corresponding interface block 245 based on one or more sensors.

In some examples, circuitry of interface blocks 220, interface blocks 245, or a logic block 230, or any combination thereof may include components (e.g., transistors) formed at least in part from doped portions of a substrate of the respective die. In some examples, a substrate of a die 205 may have characteristics that are different from those of a substrate of a die 240. Additionally, or alternatively, in some examples, transistors formed from a substrate of a die 205 may have characteristics that are different from transistors formed from a substrate of a die 240 (e.g., in accordance with different transistor architectures).

In some examples, the interface blocks 220 may support a layout for one or more components within the 220. For example, the layout may include pairing components to share an access port (e.g., a command port, a data port). Further, in some examples, the layout may support interfaces for a controller 215 (e.g., a host interface 216) that are different from interfaces for an interface block 245 (e.g., via the buses 221). For instance, a host interface 216 may be synchronous and have separate channels for read and write operations, while an interface via buses 221 and 246 may be asynchronous and support both read and write operations with the same channel.

A die 240 may include one or more units 265 (e.g., modules) that are separated from a semiconductor wafer having a pattern (e.g., a two-dimensional pattern) of units 265. Although each die 240 of the system 200 is illustrated with a single unit 265 (e.g., unit 265-*a*-1 of die 240-*a*-1, unit 265-*a*-2 of die 240-*a*-2), a die 240 in accordance with the described techniques may include any quantity of units 265, which may be arranged in various patterns (e.g., sets of one or more units 265 along a row direction, sets of one or more units 265 along a column direction, among other patterns). Each unit 265 may include at least the circuitry of a respective interface block 245, along with memory array(s) 250, a bus 251, a bus 246, and one or more contacts 247 corresponding to the respective interface block 245. In some examples, where applicable, each unit 265 may also include one or more buses 255, contacts 256, contacts 257, or contacts 260 (e.g., associated with a respective interface block 245 of a unit 265 of a different die 240), which may support various degrees of stackability or modularity among or via units 265 of other dies 240.

In some examples, the interface blocks 220 may include circuitry configured to receive first access command signaling from a host processor 210 or a controller 215 (e.g., via a host interface 216, via one or more contacts 212 from a host processor 210 or controller 215 external to a die 205), and to transmit second access command signaling to the respective (e.g., coupled) interface block 245 based on (e.g., in response to) the received first access command signaling. The interface blocks 245 may accordingly include circuitry configured to receive the second access command signaling from the respective interface block 220 and, in some examples, to access a respective set of one or more memory arrays 250 based on (e.g., in response to) the received second access command signaling. In various examples, the first access command signaling may include access commands that are associated with a type of operation (e.g., a read operation, a write operation, a refresh operation, a memory management operation), which may be associated with an indication of an address of the one or more memory arrays 250 (e.g., a logical address, a physical address). In some examples, the first access command signaling may include an indication of a logical address associated with the memory arrays 250, and circuitry of an interface block 220 may be configured to generate the second access command signaling to indicate a physical address associated with the memory arrays 250 (e.g., a row address, a column address, using a logical-to-physical (L2P) table or other mapping or calculation functionality of the interface block 220).

In some examples, to support write operations of the system 200, circuitry of the interface blocks 220 may be configured to receive (e.g., from a host processor 210, from a controller 215, via a host interface 216, via one or more contacts 212 from a host processor 210 or controller 215 external to a die 205) first data signaling associated with the first access command signaling, and to transmit second data signaling (e.g., associated with second access command signaling) based on received first access command signaling and first data signaling. The interface blocks 245 may accordingly be configured to receive second data signaling, and to write data to one or more memory arrays 250 (e.g., in accordance with an indicated address associated with the first access command signaling) based on the received second access command signaling and second data signaling. In some examples, the interface blocks 220 may include an error control functionality (e.g., error detection circuitry, error correction circuitry, error correction code (ECC) logic, an ECC engine) that supports the interface blocks 220 generating the second data signaling based on performing an error control operation using the received first data signaling (e.g., detecting or correcting an error in the first data signaling, determining one or more parity bits to be conveyed in the second data signaling and written with the data).

In some examples, to support read operations of the system 200, circuitry of the interface blocks 245 may be configured to read data from the memory arrays 250 based on received second access command signaling, and to transmit first data signaling based on the read data. The interface blocks 220 may accordingly be configured to receive first data signaling, and to transmit second data signaling (e.g., to a host processor 210, to a controller 215, via a host interface 216, via one or more contacts 212 to a host processor 210 or controller 215 external to a die 205) based on the received first data signaling. In some examples, the interface blocks 220 may include an error control functionality that supports the interface blocks 220 generating the second data signaling based on performing an error control operation using the received first data signaling (e.g., detecting or correcting an error in the first data signaling, which may include a calculation involving one or more parity bits received with the first data signaling).

In some examples, access command signaling that is transmitted by the interface blocks 220 to the interface blocks 245, among other signaling, may be generated (e.g., based on access command signaling received from a host processor 210, based on initiation signaling received from a host processor 210, without receiving or otherwise independent from signaling from a host processor 210) in accordance with various determination or generation techniques configured at the interface blocks 220 (e.g., based on a configuration for accessing memory arrays 250 that is modified at the interface blocks 220). In some examples, such techniques may involve signaling or other coordination with a logic block 230, a host processor 210, one or more controllers 215, one or more instances of non-volatile storage, one or more sensors, or any combination thereof. Such techniques may support the interface blocks 220 configuring aspects of the access operations performed on the memory arrays 250 by a respective interface block 245, among other operations. For example, interface blocks 220 may include evaluation circuitry, access configuration circuitry, signaling circuitry, scheduling circuitry, repair circuitry, refresh circuitry, error control circuitry, adverse access circuitry, and other circuitry operable to configure operations associated with one or more dies (e.g., operations associated with accessing memory arrays 250 of the dies 240). By including such components in the interface blocks 220 in accordance with one or more of the described techniques, a system may support an increased throughput of information, or a greater storage density, among other advantages, compared with other techniques for configuring a memory system.

Figure 3:
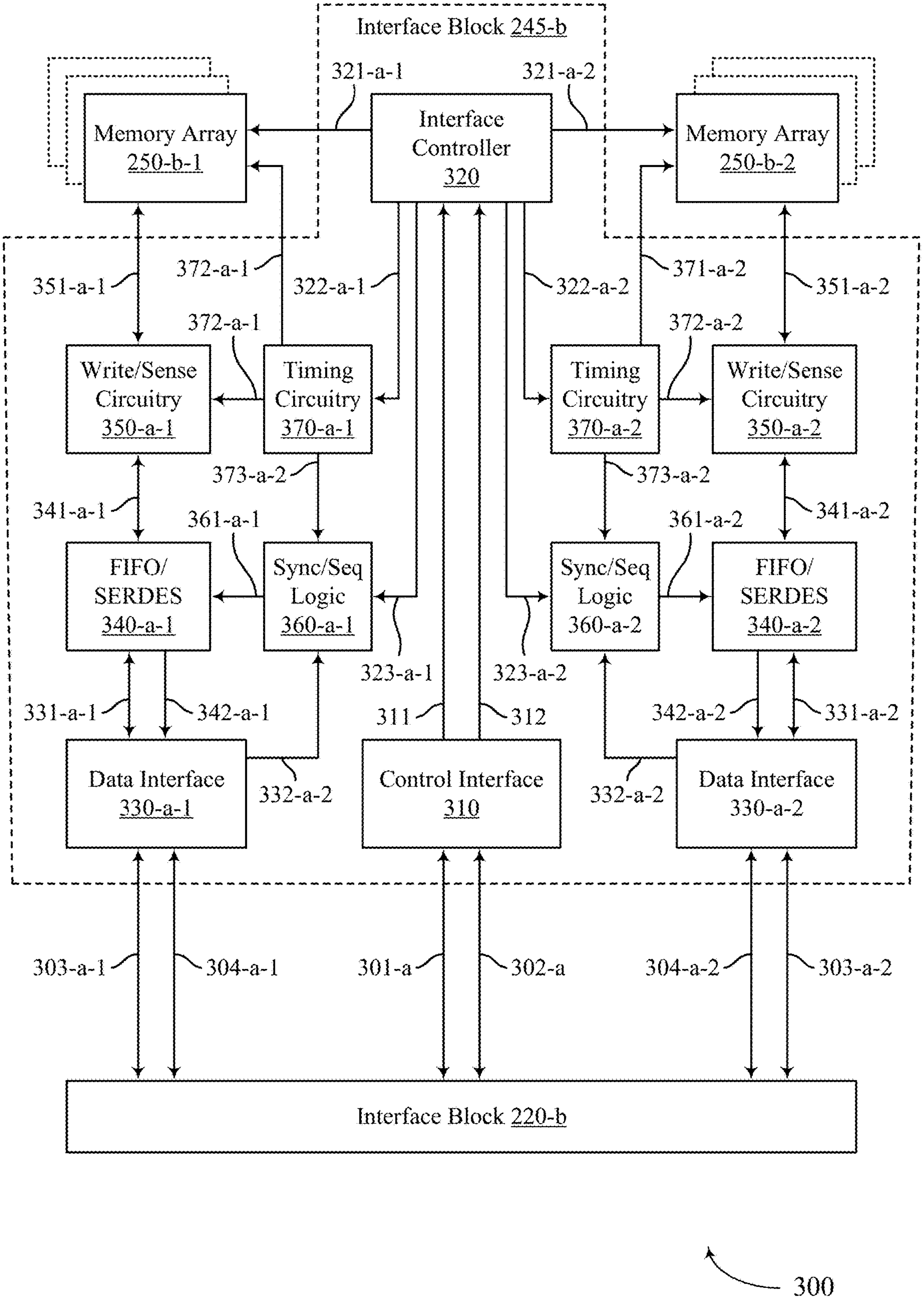
FIGS. 3 and 4 show examples of an interface architecture that supports interface techniques for stacked memory architectures in accordance with examples as disclosed herein.

FIG. 3 illustrates an example of an interface architecture 300 that supports interface techniques for stacked memory architectures in accordance with examples as disclosed herein. The interface architecture 300 illustrates an example of an interface block 245-*b* (e.g., of a die 240) coupled with an interface block 220-*b* (e.g., of a die 205). The interface block 245-*b* may be communicatively coupled with the interface block 220-*b* via one or more of a bus 301, a bus 302, a bus 303, and a bus 304, each of which may be examples of one or more signal paths of a bus 221 and a bus 246, as well as a bus 255, where applicable.

The interface block 245-*b* includes a control interface 310 (e.g., a command interface), which may be configured to communicate signaling with the interface block 220-*b*. For example, the control interface 310 may include circuitry (e.g., a receiver, one or more latches) configured to receive control signaling (e.g., modulated control signaling, access command signaling, configuration signaling, address signaling, such as row address signaling or column address signaling) over the bus 301-*a*. The control interface 310 also may include circuitry configured to receive clock signaling (e.g., clock signaling associated with the control interface 310, clock signaling having one or more phases, such as true and complement phases, dk_t/c signaling from the interface block 220-*b*) over the bus 302-*a*, which the control interface 310 may use for receiving the control signaling of the bus 301-*a* (e.g., for triggering the one or more latches). The control interface 310 may transmit (e.g., forward) the control signaling over a bus 311, and may transmit the clock signaling over a bus 312 (e.g., for timing of other operations of the interface block 245-*b*), each of which may be received by an interface controller 320.

The interface block 245-*b* also includes two data interfaces 330 (e.g., data interfaces 330-*a*-1 and 330-*a*-2), which also may be configured to communicate signaling with the interface block 220-*b*. Each data interface 330 may include corresponding buses and circuitry, the operation of which may be associated with (e.g., controlled by, coordinated with, operated based on) control signaling via the control interface 310. Although the example of interface block 245-*b* includes two such data interfaces 330 associated with the control interface 310 (e.g., in a "channel pair" arrangement), the described techniques for an interface block 245 may include any quantity of one or more data interfaces 330, and associated buses and circuitry, for a given control interface 310 of the interface block 245. Each data interface 330 may be associated with respective data path circuitry, which may include respective first-in-first-out (FIFO) and serialization/deserialization (SERDES) circuitry (e.g., FIFO/SERDES 340), respective write/sense circuitry 350, respective synchronization and sequencing circuitry (e.g., sync/seq logic 360), and respective timing circuitry 370, along with interconnecting signal paths (e.g., one or more buses). However, in some other examples, data path circuitry may be arranged in a different manner, or may include different circuitry components, which may include circuitry that is dedicated to respective data paths, or shared among data paths, or various combinations thereof. Each data interface 330 also may be associated with a respective set of one or more memory arrays 250. In some examples, each memory array 250 may be understood to include respective addressing circuitry such as bank logic or decoders (e.g., a row decoder, a column decoder), among other array circuitry. However, in some other examples, at least a portion of such circuitry may be included in the interface block 245.

Each data interface 330 may include circuitry (e.g., one or more latches, one or more drivers) configured to communicate (e.g., receive, transmit) data signaling (e.g., modulated data signaling, DQ signaling) over a respective bus 303. Each data interface 330 also may include circuitry to communicate clock signaling over a respective bus 304, which may support clock signal reception by the data interface 330 (e.g., first clock signaling associated with the data interface 330, clock signaling having one or more phases, such as true and complement phases, DQS_t/c signaling from the interface block 220-*b*, clock signaling associated with data reception or write operations), or clock signal transmission by the data interface 330 (e.g., second clock signaling associated with the data interface 330, RDQS_t/c signaling to the interface block 220-*b*, clock signaling associated with data transmission or read operations), or both. Each data interface 330 may transmit clock signaling (e.g., received clock signaling, DQS_t/c signaling) over a respective bus 332 (e.g., for timing of other operations of the interface block 245-*b*).

The interface controller 320 may support various control or configuration functionality of the interface block 245-*b* for accessing or otherwise managing operations of the coupled memory arrays 250. For example, the interface controller 320 may support access command coordination or configuration, latency or timing compensation, access command buffering (e.g., in accordance with a first-in-first-out FIFO or other organizational scheme), mode registers or logic for configuration settings, or test functionality, among other functions or combinations thereof. For each data path of the interface block 245 (e.g., associated with a respective data interface 330), the interface controller 320 may be configured to transmit signaling to the respective memory arrays 250 over a bus 321 (e.g., address signaling, such as a row address or row activation signaling), to transmit signaling to the respective timing circuitry 370 over a bus 322 (e.g., timing signaling, which may be based on clock signaling received via the bus 312, configuration signaling), and to transmit signaling to the respective sync/seq logic 360 over a bus 323 (e.g., timing signaling, which may be based on clock signaling received via the bus 312, configuration signaling).

For each data path, the respective timing circuitry 370 may support timing of various operations (e.g., activations, coupling operations, signal latching, signal driving) relative to timing signaling received over a bus 322. For example, timing circuitry 370 may include a timing chain (e.g., a global column timing chain) configured to generate one or more clock signals or other initiation signals for controlling operations of the respective data path, and such signaling may include transitions (e.g., rising edge transitions, falling edge transitions, on/off transitions) that are offset from, at a different rate than, or otherwise different from transitions of signaling over the bus 322 to support a given operation or combination of operations. For example, timing circuitry 370 may be configured to transmit signaling to the respective memory arrays 250 over a bus 371 (e.g., column selection signaling, column address signaling), to transmit signaling to the respective write/sense circuitry 350 over a bus 372 (e.g., latch or driver timing signaling), and to transmit signaling to the respective sync/seq logic over a bus 373 (e.g., timing signaling).

For each data path, the respective FIFO/SERDES 340 may be configured to convert between data signaling of a first bus width (e.g., a relatively wide bus width, associated with a bus 341 (e.g., a data read/write (DRW) bus), having a relatively larger quantity of signal paths) and a second bus width (e.g., a relatively narrow bus width, associated with a bus 331, having a relatively smaller quantity of signal paths). In some examples, such a conversion may be accompanied by changing a rate of signaling between the bus 341 and the bus 331 (e.g., to maintain a given throughput). For example, a FIFO/SERDES 340 may support a conversion between the bus 341 having a bus width of 288 signal paths (e.g., for signaling Dat [287:0]) and the bus 331 having a bus width of 72 signal paths (e.g., for signaling DQ [71:0]), in which case a rate of signaling over the bus 331 may be four times as fast as a rate of signaling over the bus 341. In various examples, the FIFO/SERDES may receive data signaling over the bus 331 and transmit data signaling over the bus 341 (e.g., to support a write operation), or may receive data signaling over the bus 341 and transmit data signaling over the bus 331 (e.g., to support a read operation). In some examples (e.g., to support a read operation), the FIFO/SERDES 340 may be configured to transmit clock signaling (e.g., RDQS_t/c signaling) to the data interface 330, which may be forwarded to the interface block 220-*b* (e.g., over a bus 304, for reception of data signaling by the interface block 220-*b* received over a bus 331).

The timing or other synchronization of operations performed by the FIFO/SERDES 340 may be supported by one or more clock signals, among other signaling, received from the respective sync/seq logic 360 (e.g., over a bus 361). For example, the sync/seq logic 360 may generate or otherwise coordinate clock signaling to support the different rates of signaling of the bus 331 and the bus 341 (e.g., based on clock signaling received over a bus 332 and a bus 373). Additionally, or alternatively, the FIFO/SERDES 340 may operate in a direction (e.g., for data transmission to a data interface 330, for data reception from a data interface 330) or other mode based on configuration signaling received from the sync/seq logic 360.

For each data path, the respective write/sense circuitry 350 may be configured to support the accessing (e.g., data signaling, write signaling, read signaling) of the respective set of one or more memory arrays 250. For example, the write/sense circuitry 350 may be coupled with the memory arrays 250 over a bus 351 (e.g., a global input/output (GIO) bus), which may include respective signal paths associated with each memory array 250, or may include signal paths that are shared for all of the memory arrays 250 of the set, in which case the memory array circuitry may include multiplexing circuitry operable to couple the bus 351 with a selected one of the memory arrays 250. In some examples, a bus 351 may include a same quantity of signal paths as a bus 341 (e.g., for signaling GIO [287:0]). In some examples, a bus 351 may include a same quantity of signal paths as a quantity of columns in each memory array 250. In some other examples, the memory arrays 250 may include a quantity of columns that is an integer multiple of the quantity of signal paths of a bus 351, in which case the memory array circuitry (e.g., each memory array 250) may include decoding circuitry operable to couple a subset of columns of memory cells, or associated circuitry, with the bus 351.

To support write operations, the write/sense circuitry 350 may be configured to drive signaling (e.g., over the bus 351) that is operable to write one or more logic states to memory cells of the memory arrays 250 (e.g., based on data received over a bus 341, based on timing signaling received over a bus 371, based on data signaling received over a bus 303 and on control signaling received over a bus 301-*a*). In some examples, such signaling may be transmitted to supporting circuitry of or otherwise associated with the memory arrays 250 (e.g., as an output of signals corresponding to logic states to be written), such as sense amplifier circuitry, voltage sources, current sources, or other driver circuitry operable to apply a bias across a storage element of the memory cells (e.g., across a capacitor, across a ferroelectric capacitor), or apply a charge, a current, or other signaling to a storage element of the memory cells (e.g., to apply a current to a chalcogenide or other configurable memory material, to apply a charge to a gate of a NAND memory cell), among other examples.

To support read operations, the write/sense circuitry 350 may be configured to receive signaling (e.g., over the bus 351) that the write/sense circuitry 350 may further amplify for communication through the interface block 245-*b*. For example, the write/sense circuitry 350 may be configured to receive signaling corresponding to logic states read from the memory arrays 250, but at a relatively low driver strength (e.g., relatively 'analog' signaling, which may be associated with a relatively low drive strength of sense amplifiers of the memory arrays 250). The write/sense circuitry 350 may thus include further sense amplification (e.g., a data sense amplifier (DSA) between each signal path of the bus 351 and a respective signal path of the bus 341), which each may have a relatively high drive strength (e.g., for driving relatively 'digital' signaling over the bus 341).

The features of the interface architecture 300 may be duplicated in various quantities and arrangements to support a semiconductor system having multiple dies, such as various examples of a system 200. In an example implementation, each die 240 may be configured with 64 instances of the interface block 245-*b*, which may support a data signaling width of 9,216 signal paths for each die 240 (e.g., where each bus 303 of a channel pair is associated with 72 signal paths). For a system 200 having a stack of eight dies 240 coupled with a die 205, the die 205 may thus be configured with 512 instances of the interface block 220-*b*, thereby supporting an overall data signaling width of 73, 738 signal paths for the system 200. However, in other implementations, dies 205 and dies 240 may be configured with different quantities of interface blocks 220 and 245, respectively, and a system 200 may be configured with different quantities of dies 240 per die 205. By dividing memory access circuitry among multiple semiconductor dies (e.g., a die 205 and one or more dies 240) in accordance with one or more of the described techniques, a system may be configured to support an increased throughput of information, or a greater storage density, among other advantages, compared with other techniques for configuring a memory system.

Figure 4:
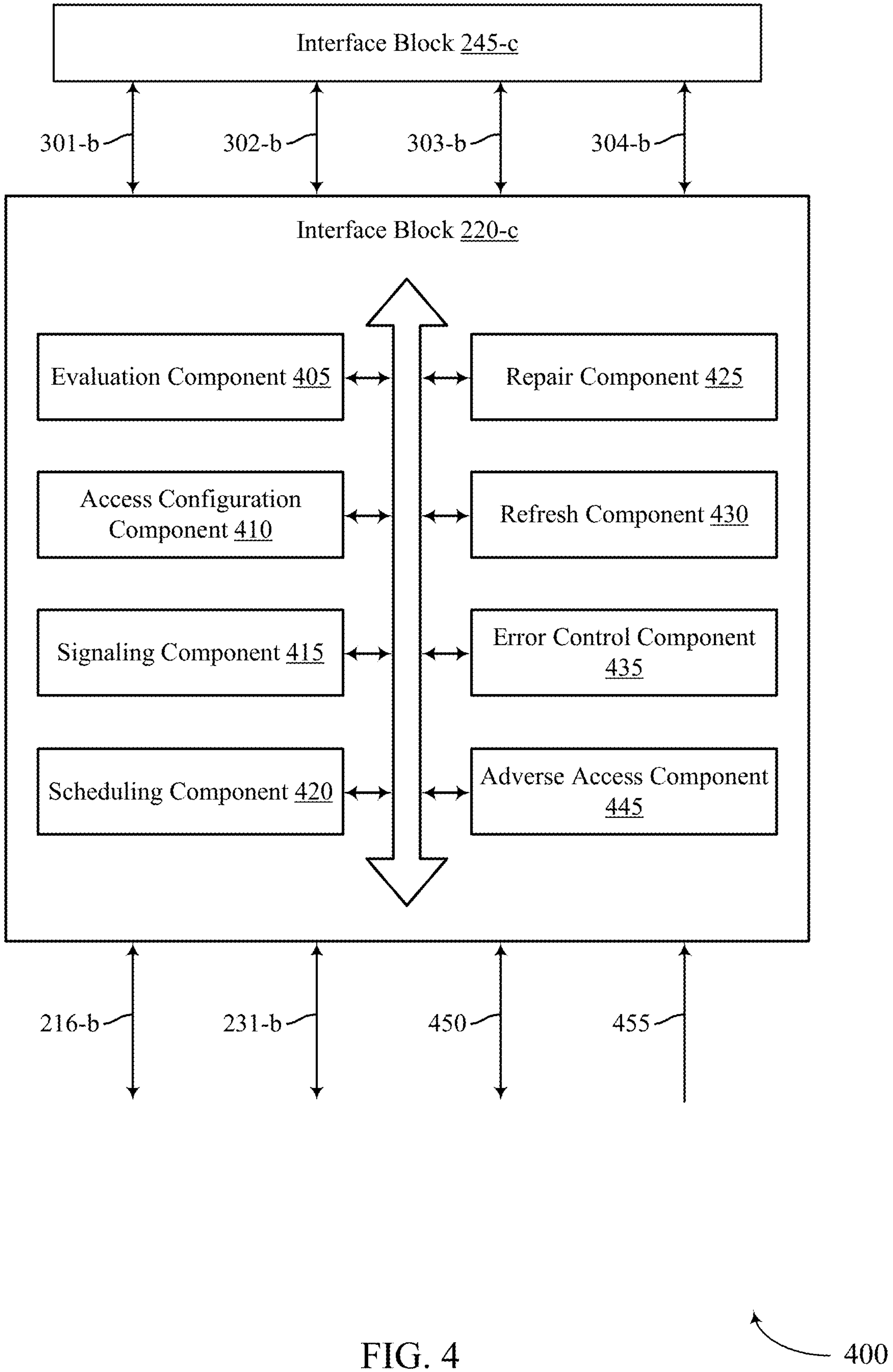

FIG. 4 shows an example of an interface architecture 400 that supports interface techniques for stacked memory architectures in accordance with examples as disclosed herein. The interface architecture 400 illustrates an example of an interface block 220-*c* (e.g., of a die 205) coupled with an interface block 245-*c* (e.g., of a die 240). The interface block 220-*c* illustrates an example of components that may be included to support various configurations of operations for accessing memory arrays 250 (e.g., via the interface block 245-*c*), among other operations of a system (e.g., of a system 200). For example, the interface block 220-*c* may include an evaluation component 405, an access configuration component 410, a signaling component 415, a scheduling component 420, a repair component 425, a refresh component 430, an error control component 435, an adverse access component 445, or any combination thereof.

One or more components of the interface block 220-*c* may be communicatively coupled with one or more components outside the interface block 220-*c*. For example, one or more components of the interface block 220-*c* may be communicatively coupled with the interface block 245-*c* via one or more of a bus 301-*b*, a bus 302-*b*, a bus 303-*b*, and a bus 304-*b*. Additionally, or alternatively, one or more components of the interface block 220-*c* may be communicatively coupled with a host processor 210 or a controller 215 via a host interface 216-*b*, or with a logic block 230 via a bus 231-*b*, or both. Where applicable, the bus 231-*b* may include one or more conductive lines that are dedicated to the interface block 220-*c*, or one or more conductive lines that are common to a set of multiple interface blocks 220 that include the interface block 220-*c*, or a combination thereof. In some examples, a logic block 230 that is coupled with the interface block 220-*c* (e.g., via a bus 231-*b*) may be operable based on signaling via a contact 234 (e.g., a pin), and the logic block 230 may be operable to configure one or more operations of or via the interface block 220-*c* based on signaling communicated via the contact 234. Additionally, or alternatively, a logic block 230 that is coupled with the interface block 220-*c* may be coupled with a host processor 210, and the logic block 230 may transmit signaling to the interface block 220-*c* based on signaling received from the host processor 210.

In some examples, the interface block 220-*c* may be coupled with one or more instances of non-volatile storage (e.g., a non-volatile storage 235, one or more instances of non-volatile storage 270) via a bus 450, or one or more sensors (e.g., one or more sensors 237, one or more sensors 275) via a bus 455, or a combination thereof. In some examples, one or more components of the interface block 220-*c* may configure operations based on information (e.g., instructions, parameters) received from non-volatile storage, or based on signaling associated with an output from the one or more sensors (e.g., a sensor measurement), or a combination thereof.

An evaluation component 405 may be configured to perform one or more functions such as a self-test (e.g., a built-in self-test (BIST)) functionality, manufacturing evaluations, writing initial conditions to the one or more instances of non-volatile storage, among other examples. For example, an evaluation component 405 may be configured to generate an access pattern (e.g., a pattern for accessing one or more memory arrays 250 via the interface block 245-*c*) for evaluating various operations of the interface block 245, of one or more memory arrays 250, or a combination thereof, and transmit access command signaling, data signaling, or both in accordance with the generated access pattern. In various examples, an evaluation component 405 may be configured to initiate such an evaluation based on signaling received from a logic block 230 (e.g., via the bus 231-*b*, based on signaling via a contact 234), from a controller 215, from the interface block 245-*c*, instructions stored in non-volatile storage, signaling from the one or more sensors, or a combination thereof. Additionally, or alternatively, an evaluation component 405 may be configured to initiate such an evaluation based on conditions detected at the interface block 220-*c* (e.g., based on an error detection, based on determining that an operating condition satisfies a threshold). In response to such an evaluation, the interface block 220-*c* may modify a configuration for operations with the interface block 245-*c* or one or more memory arrays 250 (e.g., an operating parameter, an error control configuration, a repair configuration), or may transmit an indication of a result of the evaluation (e.g., to a logic block 230, to a controller 215, to the interface block 245-*c*, to a host processor 210), among other responsive operations.

An access configuration component 410 may be configured to perform one or more access configuration functions such as interface training functions, adaptation functions, timing function, and initialization functions, among other examples. In various examples, an access configuration component 410 may configure parameters (e.g., trim parameters) the access configuration functions. For example, an access configuration component 410 may be configured to support an interface training functionality. An access configuration component 410 may be configured to synchronize, configure, or otherwise coordinate clock signal timing (e.g., frequency, phasing, offset) between the interface block 220-*c* and the interface block 245-*c*. In some examples, such training may involve the interface block 220-*c* (e.g., the signaling component 415) transmitting first clock signaling to the interface block 245-*c* and receiving second clock signaling or other signaling from the interface block 245-*c* (e.g., based on transmitting the first clock signaling). Based on such transmitted and received signaling (e.g., via the bus 302-*b* and the bus 304-*b*), the access configuration component 410 may modify a timing of the first clock signaling, or may transmit an indication to the interface block 245-*c* to modify a timing of the second clock signaling, among other aspects of interface training.

In some examples, an access configuration component 410 may be configured to support a temperature adaptation or mitigation functionality. For example, the interface block 220-*c* may receive an indication (e.g., from one or more sensors) of a temperature (e.g., an operating temperature, a temperature at which one or more components of a system 200 are operating), which may include an indication of a temperature itself (e.g., as an analog or digital input signal), or an indication of whether a temperature satisfies (e.g., is above, is below, is between) one or more thresholds, among other indications. Such an indication may be based on a temperature measured by a sensor outside a system 200, or coupled with (e.g., assembled with) a system 200, or embedded in a system 200 (e.g., one or more sensors 237 as part of a die 205, one or more sensors 275 as part of a die 240), or a combination thereof. The access configuration component 410 may configure the generation of access command signaling based on the temperature indication, which may include configuring a parameter for accessing a memory array 250 (e.g., a timing, an access rate, a reference voltage, a refresh rate) based on the temperature, selecting or avoiding a memory array 250 or portion thereof based on a temperature, inhibiting access operations based on a temperature, or implementing a temperature adjustment operation (e.g., a heating operation, a cooling operation), among other configurations or any combination thereof.

Additionally, or alternatively, an access configuration component 410 may be configured to support timing or latency control functionality. For example, an access configuration component 410 may be configured to control a timing of operations performed by the interface block 245-*c*, which may refer to an absolute timing (e.g., relative to clock signaling from a host processor 210, a controller 215, or a logic block 230), or a timing that is relative to timing of another interface block 220 (not shown), or both. For example, an access configuration component 410 may be configured to command operations via the interface block 245-*c* with a timing that is offset (e.g., staggered) relative to operations commanded by one or more other interface blocks 220. In some examples, such a staggering may balance or otherwise distribute power consumption (e.g., may reduce a ratio of peak power to average power), which may improve operational uniformity (e.g., voltage regulation uniformity) for components of a system 200. In some examples, such techniques may be supported by an access configuration component 410 being operable to configure transmission of first clock signaling to the interface block 245-*c* (e.g., in accordance with a first timing), and one or more other interface blocks 220 being configured to transmit second clock signaling to their respective interface block 245 with a timing that is offset relative to the first clock signaling.

A signaling component 415 may be configured to facilitate one or more signaling functions such as communication functions (e.g., transmitting functions, receiving functions), voltage swing conversion functions, among other examples. For example, a signaling component 415 may configure aspects of signaling for any function (e.g., procedures, operations) associated with the components of the interface block 220-*c* via one or more buses (e.g., the bus 301-*b*, the bus 302-*b*, the bus 303-*b*, the bus 304-*b*, the host interface 216-*b*, the bus 231-*b*, the bus 450, or the bus 455). In some examples, a signaling component 415 may be configured to convert or otherwise provide signaling having different voltage swings. For example, a signaling component 415 may be configured to support the interface block 220-*c* receiving first signaling (e.g., access signaling) according to a first voltage swing (e.g., associated with a die 205) and transmitting second signaling according to a second voltage swing (e.g., associated with a die 240, associated with the interface block 245-*c*) that is different from the first voltage swing. In some examples, the first voltage swing may be smaller than the second voltage swing.

A scheduling component 420 may be configured to perform one or more scheduling functions such as command prioritization, command buffering, and others. For example, the interface block 220-*c* may receive one or more commands (e.g., scheduling commands, commands for accessing a memory array 250) from a controller 215 or from a logic block 230 and may prioritize the commands based on a type of command (e.g., read command, write command). In some examples, the scheduling component 420 may include a FIFO register for buffering one or more commands. Additionally, or alternatively, a scheduling component 420 may prioritize (e.g., schedule, optimize) one or more commands based on signaling received from a logic block 230, instructions stored in non-volatile storage, an indication from one or more sensors, or a combination thereof. In some examples, the interface block 220-*c* may transmit (e.g., to the interface block 245-*c*) signaling (e.g., access signaling) according to the prioritized commands, the buffered commands, or both.

A repair component 425 may be configured to perform one or more repair functions such as repair functionality for accessing memory arrays 250 (e.g., row repair, column repair, through-silicon-via (TSV) repair, contact repair). For example, a repair component 425 may generate access command signaling based on a repair configuration such as a detected error associated with a physical address of a memory array 250 (e.g., a memory arrays 250 coupled with the interface block 245-*c*), which may include a remapping of address space (e.g., physical addresses) by the repair component 425 to avoid accessing the physical address associated with the detected error. In some examples, a repair component 425 may generate access command signaling to indicate a row address that avoids a physical address of a failed row (e.g., row repair), or to indicate a column address that avoids a physical address of a failed column, among other examples. In some examples, a repair component 425 may generate access command signaling based on signaling from a logic block 230, signaling from a controller 215, signaling from the interface block 245-*c*, instructions stored in non-volatile storage, signaling from the one or more sensors, or a combination thereof. A detected error may be associated with (e.g., may correspond to) failure or other inoperability of a row of memory cells, of a column of memory cells, or of a section of memory cells (e.g., a subarray) of a memory array 250, or of a memory array 250 among a set of multiple memory arrays 250, among other delineations of physical address space. In some examples, such an error may be detected by a repair component 425, by an error control component 435, by the interface block 245-*c* and signaled to the interface block 220-*c*, by a logic block 230 and signaled to the interface block 220-*c*, by a controller 215 or a host processor 210 and indicated to the interface block 220-*c*, or a combination thereof. In some examples, such an error may be detected in a manufacturing or validation operation, and an indication of the error may be stored in the system 200 in a manner accessible to the interface block 220-*c* (e.g., in a register of or accessible to the interface block 220-*c*, in an instance of non-volatile storage 235 or 270).

Additionally, or alternatively, a repair component 425 may be configured for other memory management techniques, which may be included as part of a reliability, availability, and serviceability (RAS) solution supported by the interface block 220-*c*. For example, a RAS solution configured at a repair component 425 may include supporting a channel data correction, such as a chip-kill or channel kill mechanism, which may involve grouping (e.g., ganging) channels together to support channel-level correctability. Additionally, or alternatively, a RAS solution configured at a repair component 425 may include supporting a cyclic redundancy check (CRC) functionality, which may be implemented for command/address integrity or data integrity. Additionally, or alternatively, a RAS solution configured at a repair component 425 may include supporting burn-in, scrubbing, test flow, qualification, or in-field BIST functionality.

Additionally, or alternatively, a RAS solution configured at a repair component 425 may include supporting a floor sweeping functionality. Floor sweeping may include a repair component 425 being operable to map out or map around regions of a die 240 (e.g., among interface blocks 245, among memory arrays 250) that are otherwise unrepairable. When mapping out or mapping around a region of a memory array 250, such regions can be as small as a single row or column within a bank or channel, or may be successively larger regions, such as array sections, multiple array sections, banks, and even entire channels. In some implementations, a die 240 may be overprovisioned to allow for remapping so that elements in a dedicated region can be used for remapping within a channel or across channels to statically or dynamically replace failing regions of varying size. In some examples, such techniques may support improvements to overall product yield (e.g., yield of dies 240, yield of systems 200), even if such techniques may reduce an amount of overall memory capacity A refresh component 430 may be configured to support refresh control functionality. For example, a refresh component 430 may be configured to generate an access pattern (e.g., a pattern of addresses) for performing refresh operations, and generate access command signaling based on the access pattern generated by the refresh component 430. Such an access pattern generation may include determining a rate for refreshing memory cells of the memory arrays 250, or addresses for refreshing, among other refresh parameters, which may be applied to each memory array 250 coupled with the interface block 245-*c*, or specific to a certain one or more of such memory arrays 250. In various examples, a refresh component 430 may be configured to determine a refresh rate, or other refresh parameter, based on signaling from a logic block 230, signaling from a controller 215, signaling from the interface block 245-*c*, signaling from one or more sensors (e.g., temperature sensors), signaling from a host processor 210, based on instructions stored in one or more instances of non-volatile storage, based on an evaluation of conditions by the refresh component 430 (e.g., based on an evaluation of access patterns), or various combinations thereof (e.g., based on an indicated access pattern, based on an indicated operating condition such as temperature or voltage).

An error control component 435 may be configured to perform one or more error control functions (e.g., error detection functions, error correction functions, error correcting code (ECC) operation), scrubbing operations, among other examples. For example, an error control component 435 may use parity information to correct errors detected in data received from (e.g., read from) the memory arrays 250 via the interface block 245-*c*, or from one or more instances of non-volatile storage (e.g., non-volatile storage 235, non-volatile storage 270). Additionally, or alternatively, an error control component 435 may correct errors detected in data received via one or more buses (e.g., the bus 301-*b*, the bus 303-*b*, the host interface 216-*b*, or the bus 231-*b*) associated with the interface block 220-*c*. In some examples, an error control component 435 may perform at least a portion of one or more error control operations based on signaling between the interface block 220-*c* and a logic block 230 (e.g., via the bus 231-*b*).

An adverse access component 445 may be configured to perform one or more adverse access mitigation functions. For example, an adverse access component 445 may be configured to support mitigation of row hammer or other adverse access patterns. An adverse access component 445 may be configured to determine (e.g., based on access command signaling received from the interface block 245-*c*, from a host processor 210, from a logic block 230, from a controller 215, or a combination thereof) that a rate of accessing one or more physical addresses of the memory arrays 250 (e.g., memory arrays 250 coupled with the interface block 245-*c*) satisfies a threshold. Such an evaluation may include determining whether a particular row of memory cells, or other portion of a memory array 250, is being accessed with a rate that meets or exceeds a threshold. An adverse access component 445 may be configured to generate access command signaling based on such an evaluation, which may include reducing a rate of accessing a particular physical address (e.g., one or more rows of memory cells), or inhibiting access to a particular physical address (e.g., for a configured duration), among other access modifications by the adverse access component 445 relative to received access command signaling (e.g., from a host processor 210, from a logic block 230, from a controller 215). Additionally, or alternatively, an adverse access component 445 may be configured to generate refresh operation signaling based on a rate of accessing one or more physical addresses satisfying a threshold (e.g., commanding refresh operations to rows in proximity of one or more hammered rows or regions that are otherwise accessed relatively frequently), where such refresh operation signaling may involve changing a rate or time of refresh, or performing refresh operations at different rates or times among memory arrays 250 or portions thereof that are coupled with the interface block 220-*c*, or performing refresh operations at different rates or times than another interface block 220 (not shown), among other examples. In various examples, an adverse access component 445 may be operable based on information stored in one or more instances of non-volatile storage, or based on an output of one or more sensors, or a combination thereof.

Figure 5:
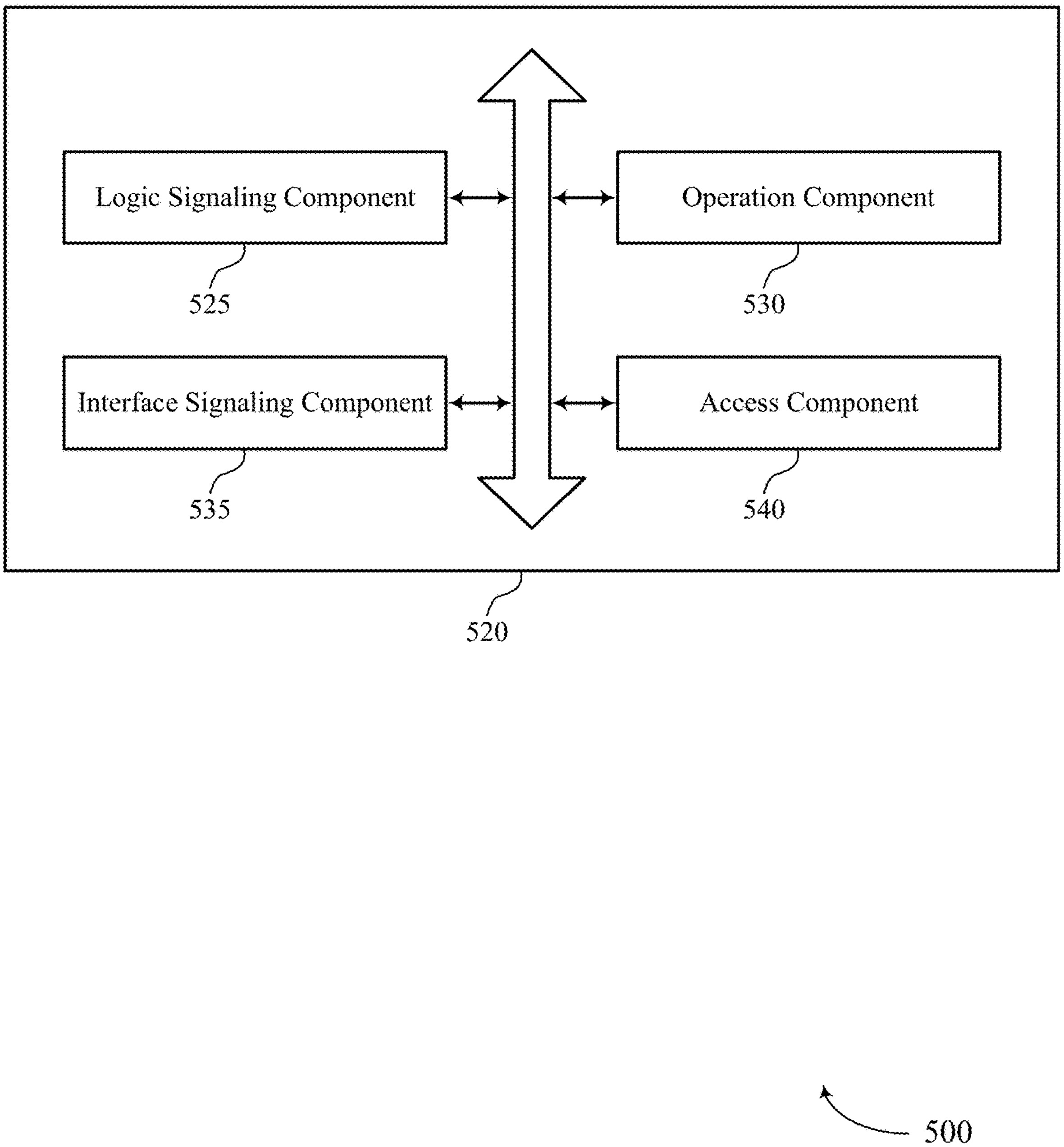
FIG. 5 shows a block diagram of a memory system that supports interface techniques for stacked memory architectures in accordance with examples as disclosed herein.

FIG. 5 shows a block diagram 500 of a memory system 520 that supports interface techniques for stacked memory architectures in accordance with examples as disclosed herein. The memory system 520 may be an example of aspects of a system or a memory system as described with reference to FIGS. 1 through 4. The memory system 520, or various components thereof, may be an example of means for performing various aspects of interface techniques for stacked memory architectures as described herein. For example, the memory system 520 may include a logic signaling component 525, an operation component 530, an interface signaling component 535, an access component 540, or any combination thereof. Each of these components may communicate, directly or indirectly, with one another (e.g., via one or more buses).

The logic signaling component 525 may be configured as or otherwise support a means for transmitting, by logic circuitry (e.g., a logic block 230) of a first semiconductor die (e.g., a die 205) in communication with a plurality of first interfaces (e.g., interface blocks 220) of the first semiconductor die, first signaling to the plurality of first interfaces.

The operation component 530 may be configured as or otherwise support a means for configuring, at each of the plurality of first interfaces, one or more operations associated with the plurality of first interfaces based on the plurality of first interfaces receiving the first signaling. The interface signaling component 535 may be configured as or otherwise support a means for transmitting, based on configuring the one or more operations, respective second signaling from at least one of the plurality of first interfaces to at least one of a plurality of second interfaces (e.g., interface blocks 245) in communication with the plurality of first interfaces, the plurality of second interfaces included in one or more second semiconductor dies (e.g., one or more dies 240) that are coupled with the first semiconductor die. The access component 540 may be configured as or otherwise support a means for accessing, by the at least one of the plurality of second interfaces, one or more memory arrays (e.g., memory arrays 250) of the one or more second semiconductor dies based on the at least one of the plurality of second interfaces receiving the respective second signaling.

In some examples, to support configuring the one or more operations, the operation component 530 may be configured as or otherwise support a means for configuring a trim parameter, a refresh parameter, a repair configuration, or an error control parameter, or a combination thereof, for access operations associated with the plurality of first interfaces based on the plurality of first interfaces receiving the first signaling.

In some examples, configuring the one or more operations may be based on instructions stored in non-volatile storage of the first semiconductor die, of at least one of the one or more second semiconductor dies, or a combination thereof. In some examples, configuring the one or more operations may be based on an output of one or more sensors of the first semiconductor die, of at least one of the one or more second semiconductor dies, or a combination thereof.

In some examples, the described functionality of the memory system 520, or various components thereof, may be supported by or may refer to at least a portion of a processor, where such a processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 520, or various components thereof, may be implemented at least in part by instructions (e.g., stored in memory, non-transitory computer-readable medium) executable by such a processor.

Figure 6:
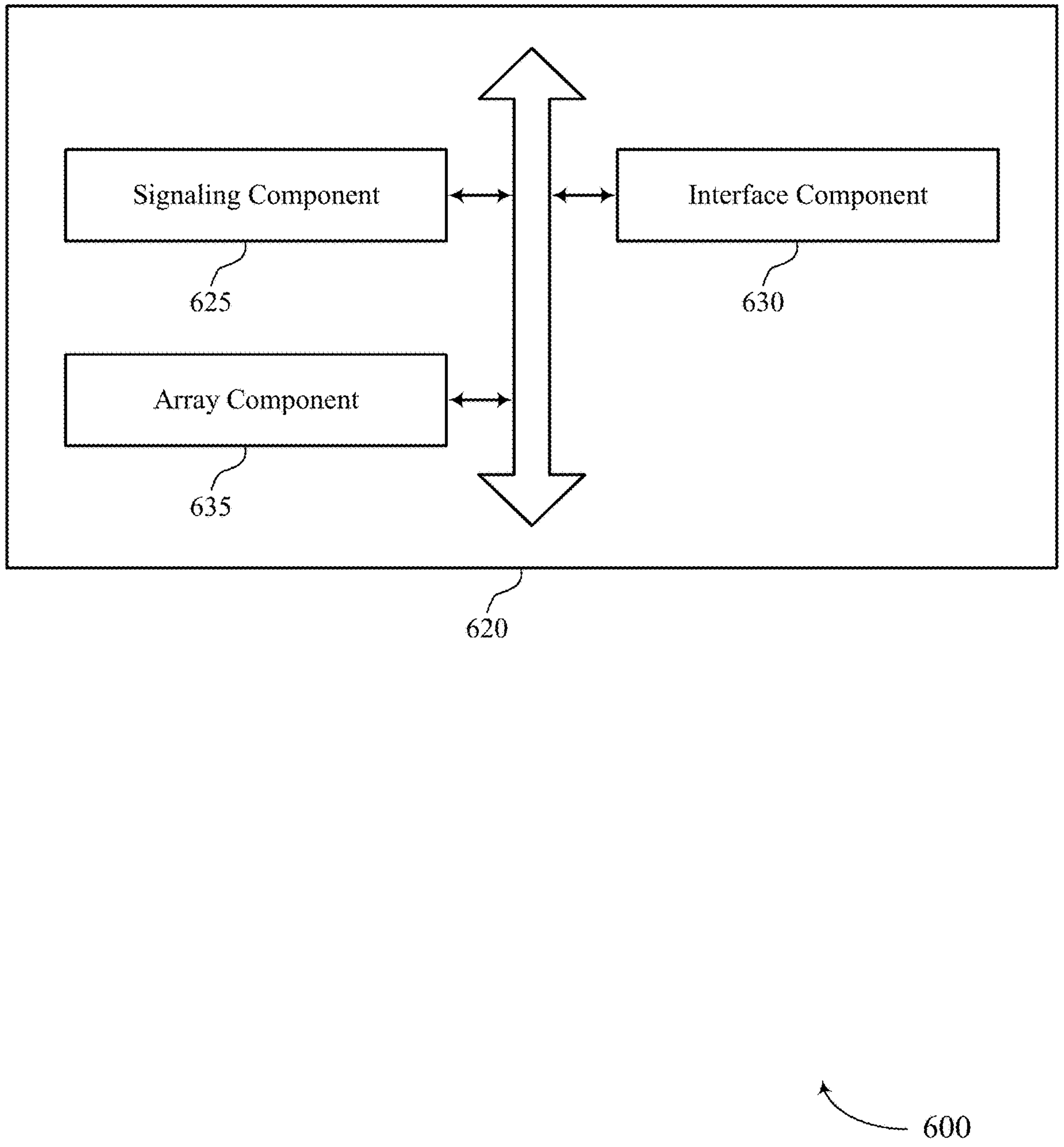
FIG. 6 shows a block diagram of a system that supports interface techniques for stacked memory architectures in accordance with examples as disclosed herein.

FIG. 6 shows a block diagram 600 of a system 620 that supports interface techniques for stacked memory architectures in accordance with examples as disclosed herein. The system 620 may be an example of aspects of a system as described with reference to FIGS. 1 through 4. The system 620, or various components thereof, may be an example of means for performing various aspects of interface techniques for stacked memory architectures as described herein. For example, the system 620 may include a signaling component 625, an interface component 630, an array component 635, or any combination thereof. Each of these components may communicate, directly or indirectly, with one another (e.g., via one or more buses).

The signaling component 625 may be configured as or otherwise support a means for transmitting, from a host processor (e.g., a host processor 210) to a controller (e.g., a controller 215) of a plurality of controllers of a first semiconductor die (e.g., a die 205), first access signaling based on determining to access an address associated with a memory array (e.g., a memory array 250) of a plurality of memory arrays of one or more second semiconductor dies (e.g., one or more dies 240) coupled with the first semiconductor die. The interface component 630 may be configured as or otherwise support a means for transmitting, from the controller to a first interface (e.g., an interface block 220) of a plurality of first interfaces of the first semiconductor die, second access signaling based on the controller receiving the first access signaling. The array component 635 may be configured as or otherwise support a means for transmitting, from the first interface to a second interface (e.g., an interface block 245) of a second semiconductor die of the one or more second semiconductor dies, third access signaling associated with accessing the memory array based on the first interface receiving the second access signaling.

In some examples, the described functionality of the system 620, or various components thereof, may be supported by or may refer to at least a portion of a processor, where such a processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the system 620, or various components thereof, may be implemented at least in part by instructions (e.g., stored in memory, non-transitory computer-readable medium) executable by such a processor.

Figure 7:
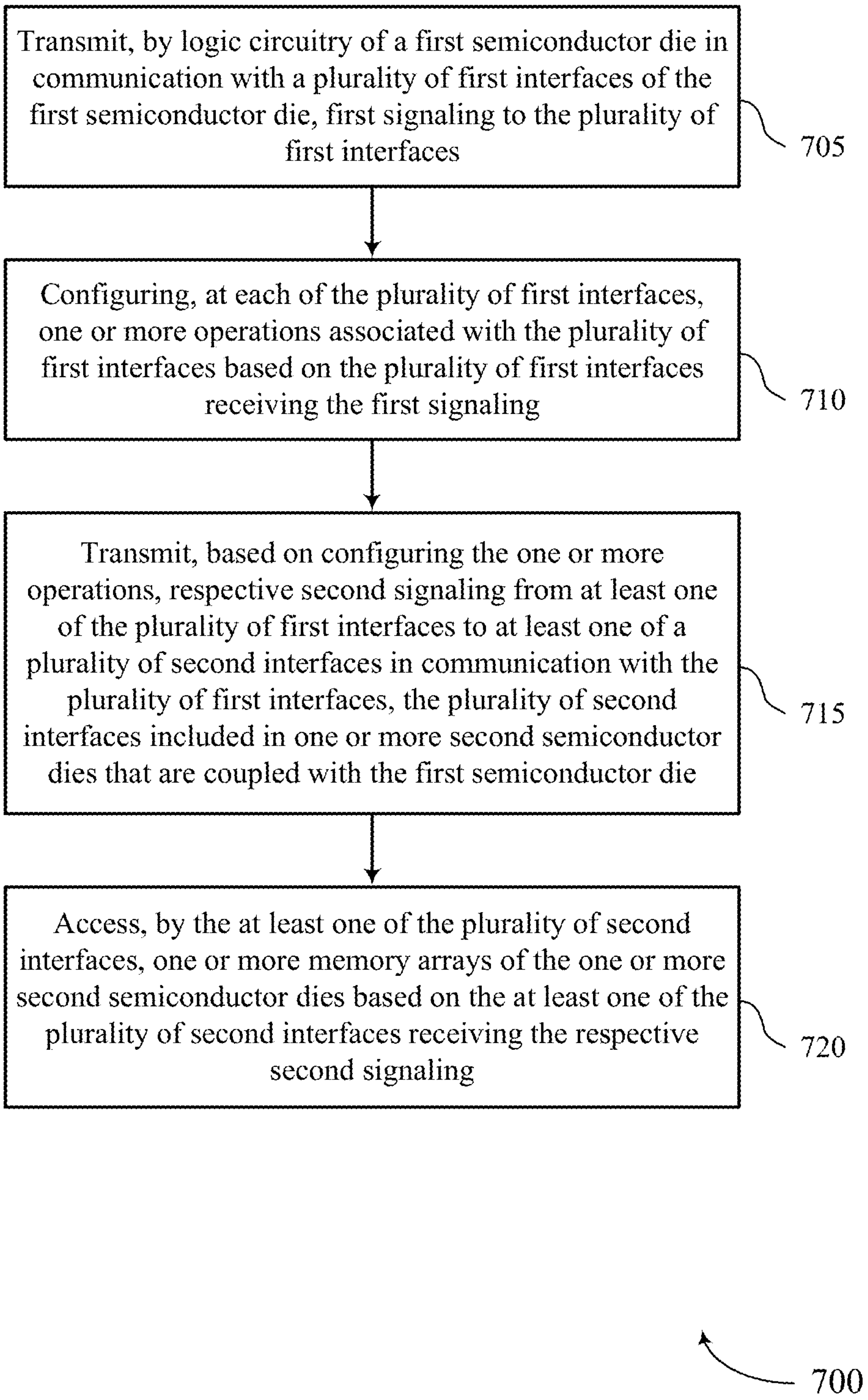
FIGS. 7 and 8 show flowcharts illustrating methods that support interface techniques for stacked memory architectures in accordance with examples as disclosed herein.

FIG. 7 shows a flowchart illustrating a method 700 that supports interface techniques for stacked memory architectures in accordance with examples as disclosed herein. The operations of method 700 may be implemented by a memory system (e.g., a memory system 110, a system 200) or its components as described herein. For example, the operations of method 700 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 705, the method may include transmitting, by logic circuitry of a first semiconductor die in communication with a plurality of first interfaces of the first semiconductor die, first signaling to the plurality of first interfaces. For example, a memory system may include a logic block 230 of a die 205 that transmits first signaling to a plurality of interface blocks 220 (e.g., via buses 231). In some examples, aspects of the operations of 705 may be performed by a logic signaling component 525 as described with reference to FIG. 5.

At 710, the method may include configuring, at each of the plurality of first interfaces, one or more operations associated with the plurality of first interfaces based on the plurality of first interfaces receiving the first signaling. For example, the memory system may include a plurality of interface blocks 220 that each configure one or more operations associated with the plurality of interface blocks 220 (e.g., as described with reference to FIG. 4) based on first signaling from a logic block 230. In some examples, aspects of the operations of 710 may be performed by an operation component 530 as described with reference to FIG. 5.

At 715, the method may include transmitting, based on configuring the one or more operations, respective second signaling from at least one of the plurality of first interfaces to at least one of a plurality of second interfaces in communication with the plurality of first interfaces, the plurality of second interfaces included in one or more second semiconductor dies that are coupled with the first semiconductor die. For example, the memory system may include a plurality of interface blocks 220 that transmit (e.g., via buses 301, buses 303, or both) respective second signaling to one or more interface blocks 245 of one or more dies 240 based on configuring one or more operations of the interface blocks 220. In some examples, aspects of the operations of 715 may be performed by an interface signaling component 535 as described with reference to FIG. 5.

At 720, the method may include accessing, by the at least one of the plurality of second interfaces, one or more memory arrays of the one or more second semiconductor dies based on the at least one of the plurality of second interfaces receiving the respective second signaling. For example, the memory system may include an interface block 245 that accesses a memory array 250 (e.g., via a bus 251) based on second signaling received from an interface block 220. In some examples, aspects of the operations of 720 may be performed by an access component 540 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for transmitting, by logic circuitry of a first semiconductor die in communication with a plurality of first interfaces of the first semiconductor die, first signaling to the plurality of first interfaces; configuring, at each of the plurality of first interfaces, one or more operations associated with the plurality of first interfaces based on the plurality of first interfaces receiving the first signaling; transmitting, based on configuring the one or more operations, respective second signaling from at least one of the plurality of first interfaces to at least one of a plurality of second interfaces in communication with the plurality of first interfaces, the plurality of second interfaces included in one or more second semiconductor dies that are coupled with the first semiconductor die; and accessing, by the at least one of the plurality of second interfaces, one or more memory arrays of the one or more second semiconductor dies based on the at least one of the plurality of second interfaces receiving the respective second signaling.

Aspect 2: The method, apparatus, or non-transitory computer-readable medium of aspect 1, where configuring the one or more operations includes operations, features, circuitry, logic, means, or instructions, or any combination thereof for configuring a trim parameter, a refresh parameter, a repair configuration, or an error control parameter, or a combination thereof for access operations associated with the plurality of first interfaces based on the plurality of first interfaces receiving the first signaling.

Aspect 3: The method, apparatus, or non-transitory computer-readable medium of any of aspects 1 through 2, where configuring the one or more operations is based on instructions stored in non-volatile storage of the first semiconductor die, of at least one of the one or more second semiconductor dies, or a combination thereof.

Aspect 4: The method, apparatus, or non-transitory computer-readable medium of any of aspects 1 through 3, where configuring the one or more operations is based on an output of one or more sensors of the first semiconductor die, of at least one of the one or more second semiconductor dies, or a combination thereof.

Figure 8:
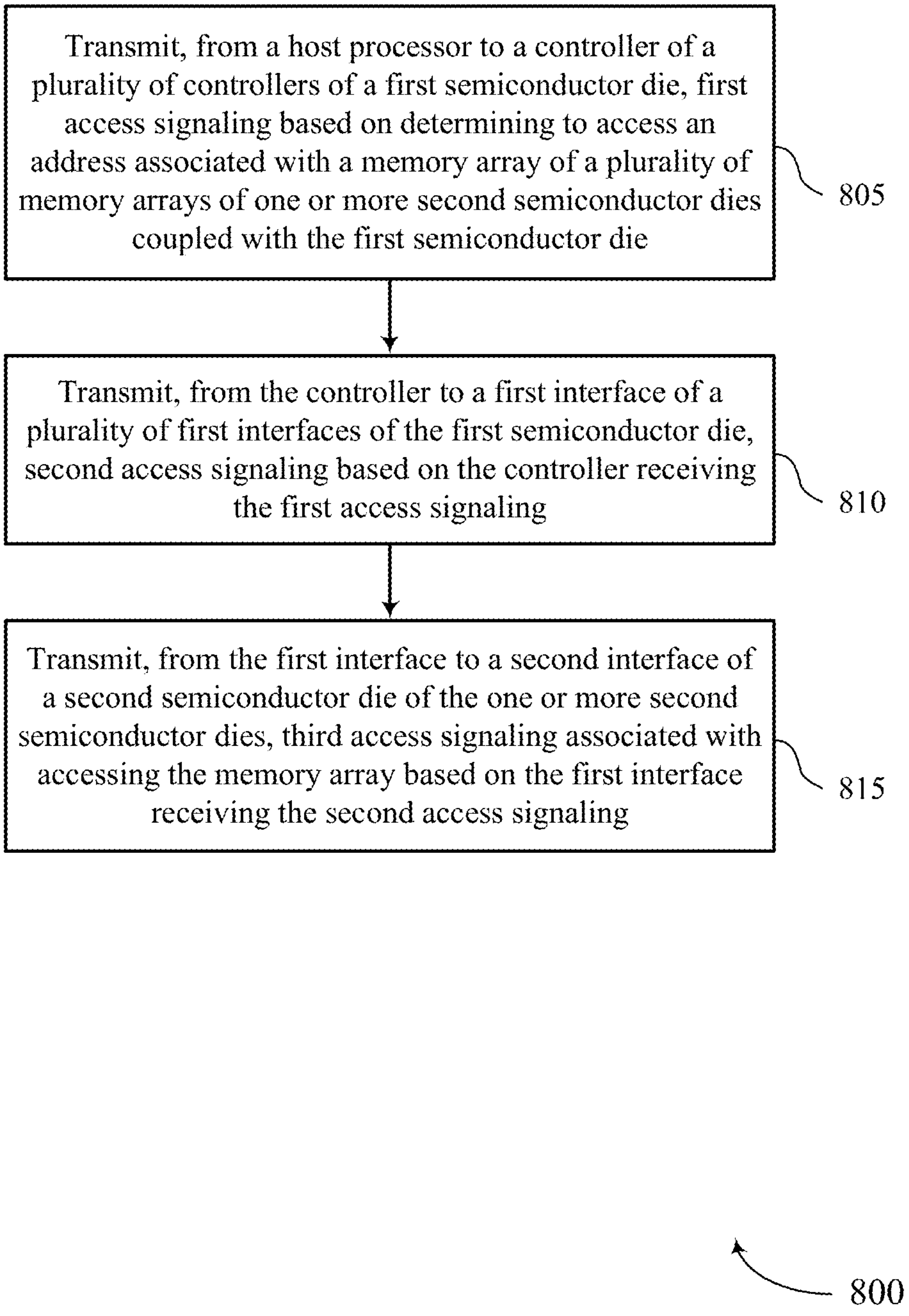

FIG. 8 shows a flowchart illustrating a method 800 that supports interface techniques for stacked memory architectures in accordance with examples as disclosed herein. The operations of method 800 may be implemented by a system (e.g., a system 200) or its components as described herein. For example, the operations of method 800 may be performed by a system as described with reference to FIGS. 1 through 4 and 6. In some examples, a system may execute a set of instructions to control the functional elements of the device to perform the described functions. Additionally, or alternatively, the system may perform aspects of the described functions using special-purpose hardware.

At 805, the method may include transmitting, from a host processor to a controller of a plurality of controllers of a first semiconductor die, first access signaling based on determining to access an address associated with a memory array of a plurality of memory arrays of one or more second semiconductor dies coupled with the first semiconductor die. For example, the system may include a host processor 210 that determines to access an address of a memory array 250 of a die 240 and transmits first access signaling to a controller 215 of a die 205 based on the determination. In some examples, aspects of the operations of 805 may be performed by a signaling component 625 as described with reference to FIG. 6.

At 810, the method may include transmitting, from the controller to a first interface of a plurality of first interfaces of the first semiconductor die, second access signaling based on the controller receiving the first access signaling. For example, the system may include a controller 215 that transmits second access signaling to an interface block 220 of a die 205 (e.g., via a host interface 216) based on first access signaling received from a host processor 210. In some examples, aspects of the operations of 810 may be performed by an interface component 630 as described with reference to FIG. 6.

At 815, the method may include transmitting, from the first interface to a second interface of a second semiconductor die of the one or more second semiconductor dies, third access signaling associated with accessing the memory array based on the first interface receiving the second access signaling. For example, the system may include an interface block 220 that transmits third access signaling to an interface block 245 of a die 240 (e.g., via a bus 301, a bus 303, or both) based on second access signaling from a controller 215. In some examples, aspects of the operations of 815 may be performed by an array component 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 5: A method, apparatus, or non-transitory computer-readable medium including operations, features, circuitry, logic, means, or instructions, or any combination thereof for transmitting, from a host processor to a controller of a plurality of controllers of a first semiconductor die, first access signaling based on determining to access an address associated with a memory array of a plurality of memory arrays of one or more second semiconductor dies coupled with the first semiconductor die; transmitting, from the controller to a first interface of a plurality of first interfaces of the first semiconductor die, second access signaling based on the controller receiving the first access signaling; and transmitting, from the first interface to a second interface of a second semiconductor die of the one or more second semiconductor dies, third access signaling associated with accessing the memory array based on the first interface receiving the second access signaling.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 6: An apparatus, including: a first semiconductor die, including: a plurality of first interfaces each including respective first circuitry operable to receive first access signaling and to transmit second access signaling based on the received first access signaling; and logic circuitry coupled with the plurality of first interfaces and operable to configure one or more operations of the plurality of first interfaces; and one or more second semiconductor dies coupled with the first semiconductor die, the one or more second semiconductor dies including: a plurality of memory arrays; and a plurality of second interfaces each coupled with a respective first interface and including respective second circuitry operable to receive the second access signaling from the respective first interface and to access a respective set of one or more of the plurality of memory arrays based on the received second access signaling.

Aspect 7: The apparatus of aspect 6, where the first semiconductor die further includes a pin coupled with the logic circuitry, the logic circuitry operable to configure the one or more operations of the plurality of first interfaces based on signaling received via the pin.

Aspect 8: The apparatus of aspect 7, where the logic circuitry is operable to perform, based on the signaling received via the pin, one or more self-test operations of the plurality of first interfaces that are associated with accessing the plurality of memory arrays.

Aspect 9: The apparatus of any of aspects 6 through 8, where the logic circuitry is coupled with a host processor of the first semiconductor die, the logic circuitry operable to configure the one or more operations of the plurality of first interfaces based on signaling received from the host processor.

Aspect 10: The apparatus of any of aspects 6 through 9, further including: non-volatile storage of the first semiconductor die, of at least one of the one or more second semiconductor dies, or a combination thereof, where the logic circuitry is operable to configure the one or more operations of the plurality of first interfaces based on information stored in the non-volatile storage.

Aspect 11: The apparatus of any of aspects 6 through 10, further including: non-volatile storage of the first semiconductor die, of at least one of the one or more second semiconductor dies, or a combination thereof, where each first interface is operable to generate the second access signaling based on information stored in the non-volatile storage.

Aspect 12: The apparatus of any of aspects 6 through 11, further including: one or more sensors of the first semiconductor die, of at least one of the one or more second semiconductor dies, or a combination thereof, where the logic circuitry is operable to configure the one or more operations of the plurality of first interfaces based on a respective output of the one or more sensors.

Aspect 13: The apparatus of any of aspects 6 through 12, further including: one or more sensors of the first semiconductor die, of at least one of the one or more second semiconductor dies, or a combination thereof, where each first interface is operable to generate the second access signaling based on a respective output of the one or more sensors.

Aspect 14: The apparatus of any of aspects 6 through 13, where each first interface of the plurality of first interfaces is configured to: receive the first access signaling in accordance with a first voltage swing; and transmit the second access signaling in accordance with a second voltage swing that is different from the first voltage swing.

Aspect 15: The apparatus of aspect 14, where the first voltage swing is smaller than the second voltage swing.

Aspect 16: The apparatus of any of aspects 6 through 15, where each first interface is operable to communicate with a host processor via one or more controllers of the first semiconductor die.

Aspect 17: The apparatus of any of aspects 6 through 16, where at least one second interface of the plurality of second interfaces is coupled with the respective first interface via one or more respective first conductor portions at a first surface of the first semiconductor die that are fused with one or more respective second conductor portions at a second surface of a second semiconductor die of the one or more second semiconductor dies.

Aspect 18: The apparatus of any of aspects 6 through 17, where the logic circuitry is coupled with each first interface via a respective conductive line, via a common conductive line, or via a combination thereof.

An apparatus is described. The following provides an overview of aspects of the apparatus as described herein:

Aspect 19: An apparatus, including: a first semiconductor die, including: a plurality of controllers operable to couple with a host processor; and a plurality of first interfaces each coupled with a controller of the plurality of controllers and including respective first circuitry configured to receive first signaling from the controller and to transmit second signaling based on the received first signaling; and one or more second semiconductor dies coupled with the first semiconductor die, the one or more second semiconductor dies including: a plurality of memory arrays; and a plurality of second interfaces each coupled with a respective first interface and including respective second circuitry operable to receive the second signaling from the respective first interface and to perform one or more operations on a respective set of one or more of the plurality of memory arrays based on the received second signaling.

Aspect 20: The apparatus of aspect 19, further including: non-volatile storage of the first semiconductor die, of at least one of the one or more second semiconductor dies, or a combination thereof, where each first interface is configured to generate the second signaling based on information stored in the non-volatile storage.

Aspect 21: The apparatus of any of aspects 19 through 20, further including: one or more sensors of the first semiconductor die, of at least one of the one or more second semiconductor dies, or a combination thereof, where each first interface is configured to generate the second signaling based on an output of at least one of the one or more sensors.

Aspect 22: The apparatus of any of aspects 19 through 21, where each first interface is configured to: receive scheduling commands from the controller; and generate the second signaling based on scheduling access operations associated with one or more memory arrays of the plurality of memory arrays.

Aspect 23: The apparatus of aspect 22, where each first interface includes a first in first out (FIFO) register for buffering the scheduling commands, each first interface configured to generate the second signaling based on buffering the scheduling commands.

Aspect 24: The apparatus of any of aspects 19 through 23, further including: logic circuitry of the first semiconductor die that is coupled with the plurality of first interfaces, the logic circuitry operable to configure generation of the second signaling of at least one first interface based on third signaling from the logic circuitry to the at least one first interface.

Aspect 25: The apparatus of any of aspects 19 through 24, where one or more of the plurality of first interfaces is configured to generate the second signaling based on a trim parameter, a refresh parameter, a repair configuration, an error control parameter, or an access pattern parameter, or a combination thereof.

Aspect 26: The apparatus of any of aspects 19 through 25, where each first interface of the plurality of first interfaces is configured to: receive the first signaling in accordance with a first voltage swing; and transmit the second signaling in accordance with a second voltage swing different from the first voltage swing.

Aspect 27: The apparatus of aspect 26, where the first voltage swing is less than the second voltage swing.

Aspect 28: The apparatus of any of aspects 19 through 27, where the first semiconductor die includes a logic block coupled with the plurality of first interfaces, the logic block configured to: communicate third signaling with the host processor, fourth signaling with at least one second semiconductor die of the one or more second semiconductor dies, or both; and perform one or more self-test operations associated with one or more memory arrays of the plurality of memory arrays.

Aspect 29: The apparatus of any of aspects 19 through 28, where at least one second interface of the plurality of second interfaces is coupled with the respective first interface via one or more respective first conductor portions at a first surface of the first semiconductor die that are fused with one or more respective second conductor portions at a second surface of a second semiconductor die of the one or more second semiconductor dies.

An apparatus is described. The following provides an overview of aspects of the apparatus as described herein:

Aspect 30: An apparatus including circuitry configured to: transmit, from a host processor to a controller of a plurality of controllers of a first semiconductor die, first access signaling based on determining to access an address associated with a memory array of a plurality of memory arrays of one or more second semiconductor dies coupled with the first semiconductor die; transmit, from the controller to a first interface of a plurality of first interfaces of the first semiconductor die, second access signaling based on the controller receiving the first access signaling; and transmit, from the first interface to a second interface of a second semiconductor die of the one or more second semiconductor dies, third access signaling associated with accessing the memory array based on the first interface receiving the second access signaling.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:

a first semiconductor die, comprising:

a plurality of first contacts;

a plurality of first interface blocks each comprising respective first circuitry operable to receive first memory access signaling in accordance with a host interface and to transmit second memory access signaling, via one or more of the plurality of first contacts, that is generated by the respective first circuitry based on the received first memory access signaling and in accordance with a second interface different from the host interface; and logic circuitry coupled with the plurality of first interface blocks and operable to configure one or more operations of each of the plurality of first interface blocks; and one or more second semiconductor dies bonded with the first semiconductor die, the one or more second semiconductor dies comprising:

a plurality of second contacts coupled with the plurality of first contacts;

a plurality of memory arrays; and a plurality of second interface blocks, each coupled with a respective first interface block of the plurality of first interface blocks, and each comprising respective second circuitry operable to receive the second memory access signaling from the respective first interface block via one or more of the plurality of second contacts and to access a respective set of one or more of the plurality of memory arrays based on the received second memory access signaling.

2. The apparatus of claim 1, wherein the first semiconductor die further comprises a pin coupled with the logic circuitry, the logic circuitry operable to configure the one or more operations of the plurality of first interface blocks based on signaling received via the pin.

3. The apparatus of claim 2, wherein the logic circuitry is operable to perform, based on the signaling received via the pin, one or more self-test operations of the plurality of first interface blocks that are associated with accessing the plurality of memory arrays.

4. The apparatus of claim 1, wherein the logic circuitry is coupled with a host processor of the first semiconductor die, the logic circuitry operable to configure the one or more operations of the plurality of first interface blocks based on signaling received from the host processor.

5. The apparatus of claim 1, further comprising:

non-volatile storage of the first semiconductor die, of at least one of the one or more second semiconductor dies, or a combination thereof, wherein the logic circuitry is operable to configure the one or more operations of the plurality of first interface blocks based on information stored in the non-volatile storage.

6. The apparatus of claim 1, further comprising:

non-volatile storage of the first semiconductor die, of at least one of the one or more second semiconductor dies, or a combination thereof, wherein each first interface block of the plurality of first interface blocks is operable to generate the second memory access signaling based on information stored in the non-volatile storage.

7. The apparatus of claim 1, further comprising:

one or more sensors of the first semiconductor die, of at least one of the one or more second semiconductor dies, or a combination thereof, wherein the logic circuitry is operable to configure the one or more operations of the plurality of first interface blocks based on a respective output of the one or more sensors.

8. The apparatus of claim 1, further comprising:

one or more sensors of the first semiconductor die, of at least one of the one or more second semiconductor dies, or a combination thereof, wherein each first interface block of the plurality of first interface blocks is operable to generate the second memory access signaling based on a respective output of the one or more sensors.

9. The apparatus of claim 1, wherein each first interface block of the plurality of first interface blocks is configured to:

receive the first memory access signaling in accordance with a first voltage swing of the host interface; and transmit the second memory access signaling in accordance with a second voltage swing of the second interface that is different from the first voltage swing.

10. The apparatus of claim 1, wherein each first interface block of the plurality of first interface blocks is operable to communicate with a host processor via one or more controllers of the first semiconductor die.

11. The apparatus of claim 1, wherein at least one second interface block of the plurality of second interface blocks is coupled with the respective first interface block via one or more respective first conductor portions at a first surface of the first semiconductor die that are fused with one or more respective second conductor portions at a second surface of a second semiconductor die of the one or more second semiconductor dies.

12. The apparatus of claim 1, wherein the logic circuitry is coupled with each first interface block of the plurality of first interface blocks via a respective conductive line, via a common conductive line, or via a combination thereof.

13. A method, comprising:

transmitting, by logic circuitry of a first semiconductor die in communication with a plurality of first interface blocks of the first semiconductor die, configuration signaling to the plurality of first interface blocks;

configuring, at respective first circuitry of each of the plurality of first interface blocks, one or more operations of the plurality of first interface blocks based on the plurality of first interface blocks receiving the configuration signaling;

transmitting, based on configuring the one or more operations of the plurality of first interface blocks, respective memory access signaling generated by the respective first circuitry of at least one of the plurality of first interface blocks to at least one of a plurality of second blocks, the plurality of second interface blocks included in one or more second semiconductor dies that are bonded with the first semiconductor die, and the plurality of second interface blocks coupled with the plurality of first interface blocks via a plurality of second contacts of the one or more second semiconductor dies that are bonded with a plurality of first contacts of the first semiconductor die; and accessing, by the at least one of the plurality of second interface blocks, one or more memory arrays of the one or more second semiconductor dies based on the at least one of the plurality of second interface blocks receiving the respective memory access signaling.

14. The method of claim 13, wherein configuring the one or more operations of the plurality of first interface blocks comprises:

configuring a trim parameter, a refresh parameter, a repair configuration, or an error control parameter, or a combination thereof, for access operations associated with the plurality of first interface blocks based on the plurality of first interface blocks receiving the configuration signaling.

15. The method of claim 13, wherein configuring the one or more operations of the plurality of first interface blocks is based on instructions stored in non-volatile storage of the first semiconductor die, of at least one of the one or more second semiconductor dies, or a combination thereof.

16. The method of claim 13, wherein configuring the one or more operations of the plurality of first interface blocks comprises is based on an output of one or more sensors of the first semiconductor die, of at least one of the one or more second semiconductor dies, or a combination thereof.

17. An apparatus, comprising:

a first semiconductor die, comprising:

a plurality of first contacts;

a plurality of controllers operable to couple with a host processor; and a plurality of first interface blocks each coupled with a controller of the plurality of controllers and comprising respective first circuitry configured to receive first signaling from the controller in accordance with a host interface and to transmit second signaling, via one or more of the plurality of first contacts, that is generated by the respective first circuitry based on the received first signaling and in accordance with a second interface different from the host interface; and one or more second semiconductor dies bonded with the first semiconductor die, the one or more second semiconductor dies comprising:

a plurality of second contacts coupled with the plurality of first contacts;

a plurality of memory arrays; and a plurality of second interface blocks each coupled with a respective first interface block of the plurality of first interface blocks and comprising respective second circuitry operable to receive the second signaling from the respective first interface block via one or more of the plurality of second contacts and to perform one or more operations on a respective set of one or more of the plurality of memory arrays based on the received second signaling.

18. The apparatus of claim 17, further comprising:

non-volatile storage of the first semiconductor die, of at least one of the one or more second semiconductor dies, or a combination thereof, wherein each first interface block of the plurality of first interface blocks is configured to generate the second signaling based on information stored in the non-volatile storage.

19. The apparatus of claim 17, further comprising:

one or more sensors of the first semiconductor die, of at least one of the one or more second semiconductor dies, or a combination thereof, wherein each first interface block of the plurality of first interface blocks is configured to generate the second signaling based on an output of at least one of the one or more sensors.

20. The apparatus of claim 17, wherein each first interface block of the plurality of first interface blocks is configured to:

receive scheduling commands in accordance with the host interface from the controller coupled with the first interface block; and generate the second signaling in accordance with the second interface based on scheduling access operations associated with one or more memory arrays of the plurality of memory arrays.

* * * * *